United States Patent [19]

Rakuljic et al.

[11] Patent Number: 5,796,096
[45] Date of Patent: Aug. 18, 1998

[54] FABRICATION AND APPLICATIONS OF LONG-LIFETIME, HOLOGRAPHIC GRATINGS IN PHOTOREFRACTIVE MATERIALS

[75] Inventors: George Anthony Rakuljic, Santa Monica; Victor Leyva, Los Angeles; Amnon Yariv, San Marino; Koichi Sayano, Montebello; Arthur Bruce O'Connor, Redondo Beach; Charles E. Tyler, Sunnyvale; Xiaoping Mao, Los Angeles; Harold Everett Miller, Jr., Westminster, all of Calif.

[73] Assignee: Accuwave Corporation, Santa Monica, Calif.

[21] Appl. No.: 422,509

[22] Filed: Apr. 13, 1995

(Under 37 CFR 1.47)

Related U.S. Application Data

[63] Continuation-in-part of Ser. No. 908,298, Jul. 2, 1992, Pat. No. 5,440,669, which is a continuation-in-part of Ser. No. 736,736, Jul. 26, 1991, abandoned.

[51] Int. Cl.$^6$ .............................. G01J 3/50; G01J 3/28; G03H 1/02; G02B 27/00
[52] U.S. Cl. .............................. 250/226; 356/28; 359/7; 359/577; 372/32
[58] Field of Search .............................. 359/7, 4, 3, 577, 359/566; 372/32; 250/226; 356/328

[56] References Cited

U.S. PATENT DOCUMENTS

| | | |
|---|---|---|
| 3,383,664 | 5/1968 | Chen et al. |
| 3,512,879 | 5/1970 | Reynolds et al. |
| 3,544,189 | 12/1970 | Chen et al. |
| 3,627,400 | 12/1971 | Caulfield |
| 3,703,328 | 11/1972 | Glass et al. |
| 3,773,400 | 11/1973 | Amodei et al. |
| 3,799,642 | 3/1974 | Phillips et al. |
| 3,873,179 | 3/1975 | Burke |
| 3,912,391 | 10/1975 | Fleisher et al. |

(List continued on next page.)

FOREIGN PATENT DOCUMENTS

| | | |
|---|---|---|
| 0 001 714 | 5/1979 | European Pat. Off. |
| 0 284 908 | 10/1988 | European Pat. Off. |
| 2 226 127 | 6/1990 | United Kingdom |

OTHER PUBLICATIONS

Carracosa, M., "Theoretical Modeling of the Fixing and Developing of Holographic Gratings in LiNbO$_3$," *Optical Society of America*, vol. 7, No. 12, Dec. 1990, see entire document.

Muller, R., "Determination of H Concentration in LiNbO$_3$ by Photorefractive Fixing," *Applied Physics Letters*, vol. 60, No. 26, Jun. 29, 1992, see entire document.

E. Kh Gulanyan et al, "Nondestructive readout of holograms . . . ",J. Quantum Elect. 9(5) 1979 (359/7).

L. Solyman and D. J. Cooke, Volume Holography and Volume Gratings, Academic Press, pp. 1–45, 1981.

(List continued on next page.)

*Primary Examiner*—Jon W. Henry
*Attorney, Agent, or Firm*—Merchant, Gould, Smith, Edell, Welter & Smith

[57] ABSTRACT

Substantial improvements in photorefractive device lifetimes are provided by control of electron migration which results in the decay of gratings in photorefractive materials due to diffusion and other effects. A new class of photorefractive devices using compensating electronic and ionic gratings having relatively low efficiency but nonetheless usable gratings is provided by arranging the gratings to be reflective in a wavelength band outside the photo-excitation band of the photorefractive material, as by using an infrared operating wavelength. Longer lifetimes in high efficiency gratings are achieved by constant or periodic illumination of photorefractive materials to assure uniform charged distribution of electrons and maintenance of the ionic backbone grating.

4 Claims, 11 Drawing Sheets

U.S. PATENT DOCUMENTS

| | | |
|---|---|---|
| 3,915,549 | 10/1975 | Amodei et al. |
| 3,932,299 | 1/1976 | Phillips . |
| 3,933,504 | 1/1976 | Phillips et al. |
| 3,997,350 | 12/1976 | Ikeo et al. |
| 4,052,119 | 10/1977 | Williams et al. |
| 4,062,618 | 12/1977 | Steensma . |
| 4,094,575 | 6/1978 | Kellie . |
| 4,103,254 | 7/1978 | Chikami ............................ 372/32 |
| 4,111,524 | 9/1978 | Tomlinson . |
| 4,153,330 | 5/1979 | Tomlinson . |
| 4,198,117 | 4/1980 | Kobayashi . |
| 4,336,976 | 6/1982 | Rodemann et . |
| 4,362,359 | 12/1982 | Dammann et al. |
| 4,420,217 | 12/1983 | Gerharz . |
| 4,420,829 | 12/1983 | Carlson . |
| 4,449,785 | 5/1984 | Huignard et al. |
| 4,452,533 | 6/1984 | Miles et al. |
| 4,522,462 | 6/1985 | Large et al. |
| 4,643,519 | 2/1987 | Bussard et al. |
| 4,669,811 | 6/1987 | McQuoid . |
| 4,671,603 | 6/1987 | McQuoid et al. |
| 4,726,655 | 2/1988 | Mahlein . |
| 4,759,596 | 7/1988 | Po et al. |
| 4,770,496 | 9/1988 | Mahlein . |
| 4,773,063 | 9/1988 | Hunsperger et al. |
| 4,805,185 | 2/1989 | Smith . |
| 4,810,047 | 3/1989 | Pernick . |
| 4,824,193 | 4/1989 | Maeda et al. |
| 4,840,456 | 6/1989 | Fye . |
| 4,879,167 | 11/1989 | Chang . |
| 4,907,237 | 3/1990 | Dahmani et al. |
| 4,919,532 | 4/1990 | Mocker et al. |
| 4,923,270 | 5/1990 | Carter . |
| 4,926,412 | 5/1990 | Jannson et al. |
| 4,927,220 | 5/1990 | Hesselink et al. |
| 4,965,152 | 10/1990 | Keys et al. |
| 4,993,032 | 2/1991 | Bradley ............................ 372/32 |
| 5,026,131 | 6/1991 | Jannson et al. |
| 5,042,042 | 8/1991 | Hori et al. |
| 5,082,337 | 1/1992 | Chern et al. |
| 5,107,359 | 4/1992 | Ohuchida . |
| 5,119,454 | 6/1992 | McMahon . |

OTHER PUBLICATIONS

Patent Abstracts of Japan, vol. 9, No. 113, (P356) May 17, 1985 & JP,A,60 000 424, (Kitagawa Shiyunji), Jan. 5, 1985.

Patent Abstracts of Japan, vol. 11, No. 171 (E–512) (2618) Jun. 2, 1987 & JP, A, 62,005 677 (Matsushita) 12 Jan. 1987.

93/11589, PCT Publication (Honeywell Inc.), Jun. 10, 1993.

Amodei et al., "Holographic Pattern Fixing in Electro–Optic Crystals," *Applied Physics Letters*, vol. 18, No. 12, p. 540, (Jun. 15, 1971).

Amodei, et al., "Holographic Recording in Lithium Niobate," vol. 33, Mar. 1972, Princeton US, pp. 71–93.

K. Bloetekjaer, "Limitations on Holographic Storage Capacity of Photochromic and Photorefractive Media," *Applied Optics*, vol. 18, No. 1, p. 57 (Jan. 1, 1979).

W.J. Burke et al., "Volume Phase Holographic Storage in Ferroelectric Crystals," *Optical Engineering*, vol. 17, No. 4, Jul.–Aug. 1978, pp. 308–316.

A.M. Glass, "The Photorefractive Effect," *Optical Engineering*, vol. 17, No. 5, p. 470.

B.I. Greene, "All–Optical Nonlinearities in Organics," *Articles*, Feb. 9, 1990.

C. Gu et al., "Diffraction Properties of Fixed Gratings in Photorefractive Media," *Journal of the Optical Society of America B: Optical Physics*, vol. 7, No. 12, Dec. 1990, pp. 2339–2346.

Hertel et al., "Theory of Thermal Hologram Fixing and Application to LiNbO$^3$:Cu", *Phys. Stat. Sol.* (a) vol. 104, p. 844 (1987).

N.V. Kukhtarev et al., "Holographic Storage in Electrooptic Crystals. I. Steady State," *Ferroelectrics*, vol. 22, pp. 949–960, 1979.

McCahon et al., "Hologram Fixing in $Bi_{12}TiO_{20}$ Using Heating and an AC Electric Field," *Applied Optics*, vol. 28, No. 11, p. 1967 (Jun. 1, 1989).

Meyer et al., "Kinetics of Fixation of Phase Holograms in $LiNbO_3$," *Phys. Stat. Sol.* (a) vol. 53, p. 171 (1979).

P. Mills et al., "Holographically Formed, Highly Selective, Infrared Filter in Iron–Doped Lithium Niobate," *Electronics Letters*, vol. 21, No. 20, Sep. 26, 1985, Enage GB, pp. 885–886.

P. Mills et al., "Single–mode Operation of 1.55 um Semiconductor Lasers Using a Volume Holographic Grating", vol. 21, No. 15, Jul. 1985, Enage GB, pp. 648–649.

Mortensen, Paul, "Dual–Focus Optical Pickup Reads Two Formats," *Laser Report*, vol. 31, No. 9 (May 1, 1995).

Ning, "Analysis of Multiplexed Reflection Holographic Gratings," *Journal of the Optical Society of America*, No. 8, pp. 1436–1440 (Aug. 1990).

Tom Parish, "Crystal Clear Storage," *Byte*, p. 283, Nov. 1990.

David M. Pepper et al., "The Photorefractive Effect," *Scientific American*, Oct. 1990.

M.P. Petrov et al., "Light Diffraction From the Volume Holograms in Electrooptic Birefringent Crystals," *Optics Communications*, vol. 29, No. 1, Apr. 1979, Amsterdam NL, pp. 44–47.

W. Phillips et al., "Optical and Holographic Storage Properties of Transition Metal Doped Lithium Niobate," *RCA Review*, vol. 33, p. 94. (Mar. 1972).

Rajbenbach et al., "Low–Noise Amplification of Ultraweak Optical Wave Fronts in Photorefractive Bi12Si020," *Optics Letters*, vol. 16, No. 19, Oct. 1991, Washington US, pp. 1481–1483.

Rakuljic et al., "Optical Data Storage by Using Orthogonal Wavelength–Multiplexed Volume Holograms," *Optics Letters*, vol. 17, No. 20 (Oct. 15, 1992).

J.F. Scott et al., "Ferroelectric Memories," *Science*, vol. 246, pp. 1400–1404, Dec. 16, 1989.

Shah et al., "Characterization of Iron–Doped Lithium Niobate for Holographic Storage Applications," *Journal of Akpplied Physics*, vol. 47, No. 12, Dec. 1976, New York US, pp. 5421–5431.

H.M. Smith, "Holographic Recording Materials," *Topics in Applied Physics*, vol. 20, 1977, Berlin, pp. 10–20.

W.V. Smith, "Large Capacity Holographic Memory," *IBM Technical Disclosure Bulletin*, vol. 15, No. 3, Aug. 1972.

J. Soechtig, "DBR Stripe Waveguide Lasers in Erbium–Diffusion–Doped $LiNbO_3$," *Laser Report* vol. 31, No. 9, May 1, 1995.

Staebler et al., "Multiple Storage and Erasure of Fixed Holograms in Fe–Doped $LiNbO_3$," *Applied Physics Letters*, vol. 26, No. 4, pp. 182 (Feb. 15, 1975).

Staebler et al., "Thermally Fixed Holograms in $LiNbO_3$," *Ferroelectrics*, vol. 3, p. 107 (1972).

Thomas Stone and Nicholas George, "Hybrid Diffractive-Refractive Lenses and Achromats," *Applied Optics*, vol. 27, No. 14, Jul. 15, 1988.

G.D. Stucky et al., "Quantum Confinement and Host/Guest Chemistry: Probing a new Dimension," *Articles*, Feb. 9, 1990.

Vladimirtsev et al., "Optical Damage in Transition Metal Doped Ferroelectric," *Ferroelectrics*, vol. 22, 1978, pp. 653–654.

W. B. Whitten et al., "Molecular Spectrometry with a Holographically Scanned CW Dye Laser and Supersonic Cooling", *Applied Spectroscopy*, vol. 39, No. 4, 1985, Baltimore US, pp. 582–586.

D.W. Woodbury et al., "Hologram Indexing in $LiNbO_3$ with a Tunable Pulsed laser Source," *Applied Optics*, vol. 18, No. 15, Aug. 1, 1979, pp. 2555–2558.

S. Wu et al., "Reconfigurable Interconnections Using Photorefractive Holograms," *Applied Optics*, vol. 29, No. 8, Mar. 10, 1990, pp. 1118–1125.

Amnon Yariv et al., "High Resolution Volume Holography Using Orthogonal Data Storage," *OSA Topical Meeting on Photorefractive Materials*, Jul. 1991, pp. 130–132.

Zech, "Volume Hologram Optical Memories: Mass Storage Future Perfect", *Optics & Photonics News*, p. 16 (Aug. 1992).

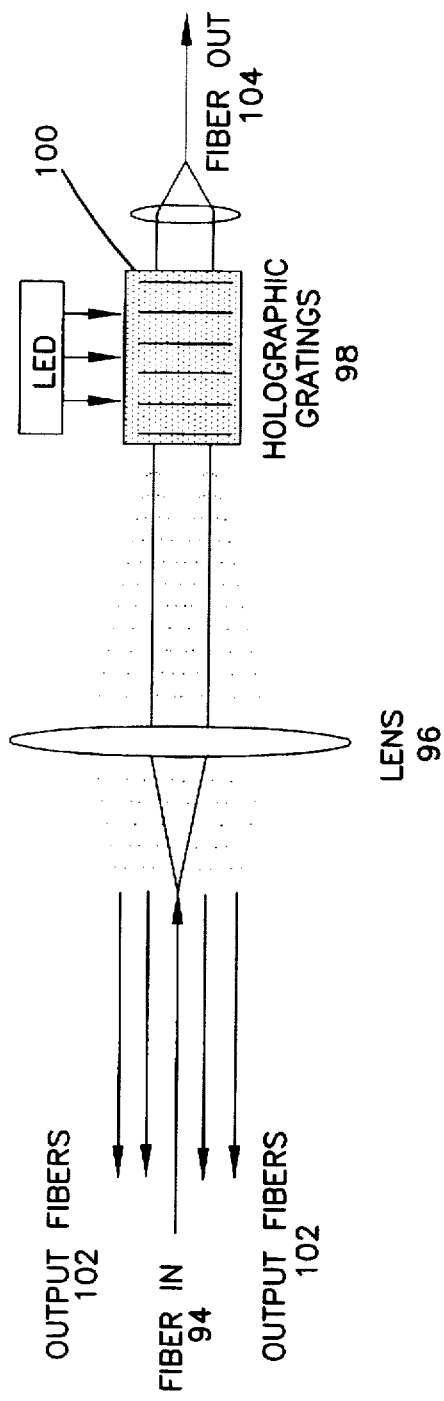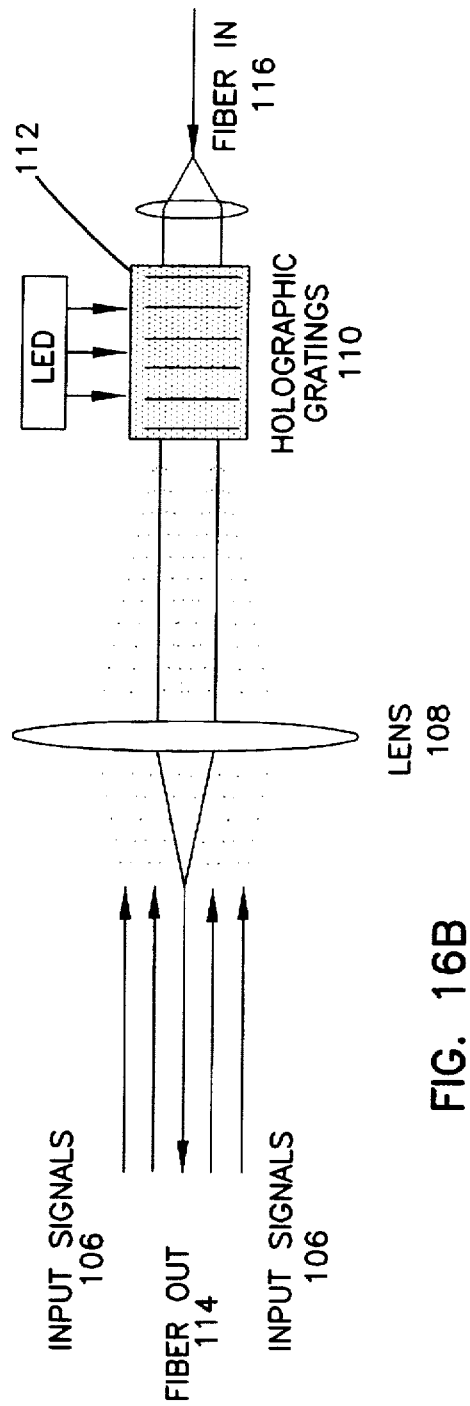

5,796,096

FABRICATION AND APPLICATIONS OF LONG-LIFETIME, HOLOGRAPHIC GRATINGS IN PHOTOREFRACTIVE MATERIALS

CROSS-REFERENCE TO RELATED APPLICATIONS

This is a continuation-in-part of U.S. patent application Ser. No. 07/908,298, entitled "Photorefractive Systems And Methods," filed Jul. 2, 1992, by G. A. Rakuljic and A. Yariv, now U.S. Pat. No. 5,440,669, issued Aug. 8, 1995, which is a continuation-in-part of U.S. patent application Ser. No. 07/736,736, entitled "Photorefractive Systems And Methods," filed Jul. 26, 1991, now abandoned, both of which applications are incorporated by reference herein.

BACKGROUND OF THE INVENTION

1. Field of the Invention

This invention relates to methods of recording and "fixing" optically insensitive, permanent (i.e. long lifetime) gratings in photorefractive materials such as $LiNbO_3$. It further relates to devices which usefully employ these gratings in telecommunications components and systems for accurate wavelength control and monitoring of optical transmitters for multi-wavelength networks and other applications requiring wavelength accurate lasers.

2. Description of Related Art

Volume hologram reflection gratings have been shown to be an extremely accurate and temperature-stable means of filtering a narrow passband of light from a broadband spectrum. This technology has been demonstrated in a number of practical applications, such as holographic grating optical filters with a 0.125 Å full width at half maximum (FWHM) passband for monochromatic imaging at the 6564.6 Å ($H_\alpha$) solar absorption wavelength and high resolution optical data storage. More recently, this technology has been used in a new class of fixed wavelength reflectors for monitoring the wavelength of 1.55 μm band optical telecommunications transmitters, multiplexers and demultiplexers for wavelength division multiplexed (WDM) systems, and wavelength-selective reflectors for 1.55 μm external cavity lasers.

Photorefractive crystals such as $LiNbO_3$ have been shown to be effective media for storing volume holographic gratings such as for optical filters or holographic optical memories with high diffraction efficiency. In conjunction with techniques for writing high diffraction efficiency reflection gratings in these materials, methods of "fixing" the gratings so they cannot easily be erased by subsequent illumination have been developed (J. J. Amodei and D. L. Staebler, "Holographic recording in lithium niobate," *RCA Review* vol. 33, pp. 71–94 (1972); V. Leyva and G. A. Rakuljic, "Fixing Method For Narrow Bandwidth Volume Holograms In Photorefractive Materials," U.S. Pat. No. 5,335,098 (1994); and G. A. Rakuljic and A. Yariv, "Photorefractive Systems And Methods," U.S. patent application Ser. No. 07/908,298 (1992)). In addition, plane gratings Bragg-matched to reflect at normal incidence in the infrared have been successfully recorded in lithium niobate using a technique of writing from the side face in a transmission mode geometry with the correct incidence angle and shorter wavelength (i.e. visible) light, where the photorefractive sensitivity of the material is much higher than in the infrared (V. Leyva, G. A. Rakuljic, and B. O'Conner, "Narrow bandwidth volume holographic optical filter operating at the Kr transition at 1547.82 nm," *Appl. Phys. Lett.* vol. 65, pp. 1079–1081 (1994)).

However, a fundamental limitation of recorded space charge gratings in photorefractive crystals is the eventual decay of even "fixed" gratings, with the process being accelerated by elevated temperatures. At 85° C., which is the upper end of the storage temperature range required of most telecommunications components, gratings have been observed to decay in less than several hours. By keeping these devices at room temperature or lower, the decay rate is slowed down, but still observable under certain conditions. Although the fixing procedures described in G. A. Rakuljic and A. Yariv, "Photorefractive Systems And Methods," U.S. patent application Ser. No. 07/908,298 (1992)) and V. Leyva and G. A. Rakuljic, "Fixing Method For Narrow Bandwidth Volume Holograms In Photorefractive Materials," U.S. Pat. No. 5,335,098 (1994) provided increased fixing efficiencies (i.e. ratio of grating magnitude after and before fixing), they still do not avoid the fundamental issue of eventual thermal decay of the so-called fixed gratings in various applications.

SUMMARY OF THE INVENTION

To overcome the limitations in the prior art as described above, and to overcome other limitations that will become apparent upon reading and understanding the present specification, particular properties of space charge gratings in nonlinear optical materials are utilized to delay or minimize the decay process. New procedures are provided for recording, in photorefractive materials, optically insensitive gratings in photorefractive materials with inherently long thermal decay times. The mechanisms and processes for extending lifetimes of stored holographic gratings function differently for both low and high efficiency grating regimes, but both reside in the control of migration of electrons subsequent to the recording process. In the lower diffraction efficiency regime, compensating electronic and ionic gratings are held in balance by isolation from external sources of photo-excitation, and illuminated with operating wavelengths which are outside the range of sensitivity of the crystal to photorefractive effects. In the high diffraction efficiency regime, electron migration from a uniform charge distribution is inhibited by constant or periodic illumination with light, either at an operating wavelength or from an external source.

It is shown that compensated gratings, in the form of a two-body system having both an electronic grating and an ionic grating, can form a residual grating pattern that is useful in a number of practical applications. Further, by maintenance of the compensated two-body relationship, decay due to ionic diffusion is minimized, and maximum lifetime is thus achieved. In accordance with more particular features, the process involves either sequential or simultaneous recording and fixation of a holographic image, in the form of the two-body grating structure, using writing beams at wavelengths in the range of sensitivity to photorefractive effects. By isolating the two-body grating from photo-excitation in this band thereafter, the recorded image is used in a practical implementation by illuminating with wave energy at a wavelength outside the sensitivity band. A practical example of a wavelength monitor/locker device is described, in which a reflective grating that reflects two slightly displaced infrared wavelengths in different directions is written by recording transmission mode holograms in a side-directed fashion. Maximum lifetime is achieved because there is no net repulsive force between the electronic and ionic gratings, such that the ionic charge distribution has minimum tendency to diffuse due to dielectric relaxation.

Applicants have therefore disproven prior assumptions that the fixed but undeveloped image, represented by the concurrent presence of both electronic and ionic gratings, could not be utilized in practical applications. There is a sufficient charge replica to establish, for many uses, a refractive index pattern having an adequate diffraction efficiency. Moreover, Applicants have identified means for increasing this fixed but undeveloped grating for various applications.

With fully developed gratings processed so as to obtain high efficiency, it is shown that diffusion and relaxation processes can be limited to the slower relaxation frequency of the modified ionic structure. This is done by preventing migration of electrons from their initially uniform charge distribution toward concentrations of ions, which tends to screen the ionic grating. This is accomplished by usage of constant illumination with light at the operating wavelength, or by application of a light from a separate photo-excitation source if the illumination is intermittent or outside the photorefractively sensitive band.

In accordance with the invention, additional applications of devices having extended lifetime gratings, including IR wavelength filters, multiplexing couplers, multi-channel wavelength monitors and external cavity laser reflectors are disclosed.

BRIEF DESCRIPTION OF THE DRAWINGS

For a better understanding of the present invention, reference is made to the following detailed description and the attached Figures, where:

FIGS. 16A and 16B disclose a variation of the device shown illustrated in FIG. 14 for use as add and drop couplers;

DETAILED DESCRIPTION OF THE INVENTION

Introduction and Background

Figure 1A:
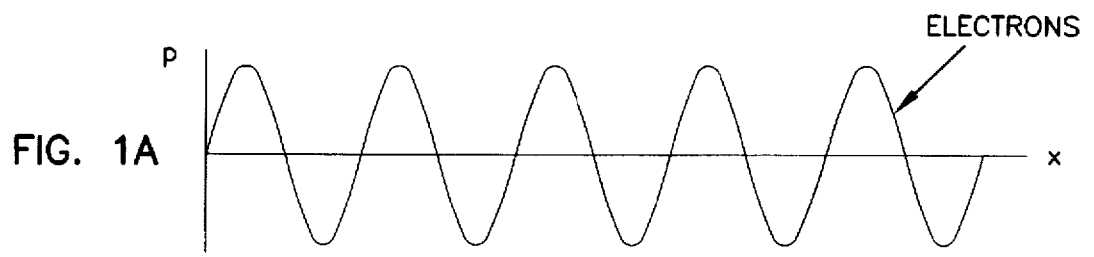
FIGS. 1A, 1B, and 1C comprises a set of waveforms 1A, 1B, and 1C illustrating charge distributions in processes for fixing holographic gratings in photorefractive materials where optically insensitive species replace the photoexcited electronic space charge distribution.
Figure 1B:
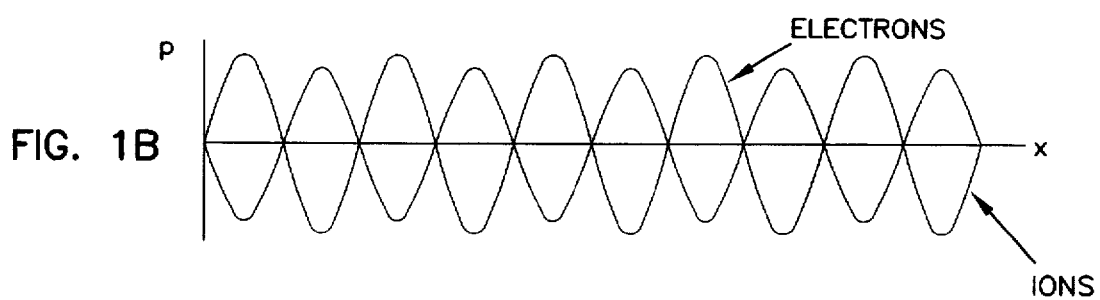
Figure 1C:
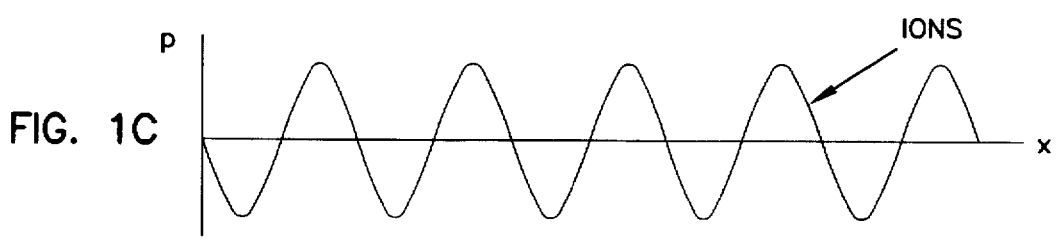

FIGS. 1A to 1C illustrate successive stages in the current fixing process for high efficiency holographic gratings in photorefractive materials, which was described in G. A. Rakuljic and A. Yariv, "Photorefractive Systems And Methods," U.S. patent application Ser. No. 07/908,298 (1992), supra. This Figure illustrates the electronic and ionic charge distributions for (a) recording the electronic grating, (b) fixing to add an ionic grating, and (c) developing the ionic grating. High conversion efficiencies from the unfixed to fixed gratings have been demonstrated in photorefractive materials such as $LiNbO_3$ through control of electric fields and temperature (cf. V. Leyva and G. A. Rakuljic, "Fixing Method For Narrow Bandwidth Volume Holograms In Photorefractive Materials," U.S. Pat. No. 5,335,098, supra; G. A. Rakuljic and A. Yariv, "Photorefractive Systems And Methods," U.S. patent application Ser. No. 07/908,298 (1992), supra). These gratings have been used for applications such as optical data storage and high spectral selectivity optical filters for both visible and infrared wavelengths.

In order to record the grating in the photorefractive crystal, it is illuminated by two writing beams (object and reference waves) from a coherent source so they interfere inside the crystal. The optical interference pattern forms a space charge grating of electrons, as shown in FIG. 1A, through the photorefractive effect (described by N. V. Kukhtarev, et al., "Holographic storage in electro-optic crystals," *Ferroelectrics* vol. 22, pp. 949–960 (1979)). This grating is formed through photo-excitation; therefore, the grating is light sensitive and will be erased when illuminated.

For device applications, the gratings must be permanently "fixed" so they will not degrade while in use in applications such as optical filtering or storage. In order to form a "permanent" grating that is not erased by illumination, a process is used whereby the light-sensitive electronic grating is replaced by a non-optically sensitive one. This was the subject of much early work on photorefractive materials at the RCA Laboratories in the 1970's. In this process, the crystal is heated to allow optically insensitive ions to move and compensate the electronic charge distribution, with the result shown schematically in FIG. 1B. Finally, the electronic charge distribution is erased (i.e. returned to its uniform distribution) by illuminating with light, ideally leaving only the optically insensitive ionic grating (cf. W. Phillips, et al., *RCA Review* (1972)).

However, although this process has been described as being permanent in much of the prior literature, the ionic grating is subject to thermal decay by the same mechanism that allows the fixing process to occur, i.e. thermal excitation and mobility of charge carriers. Normally, at room temperature, this process is much slower than at the fixing temperature, which is usually above 160° C. At elevated temperatures above 50° C., which is still below the storage temperature requirements for most telecommunications components, the grating lifetime has been observed to decrease significantly. The mechanism is dielectric relaxation, whose temperature dependence is given by the well-known equation:

$$\tau = \tau_0 \exp\left(-\frac{E_A}{kT}\right) \quad (1)$$

where $E_A$ is the activation energy, k is Boltzmann's constant, and T is the temperature. For example, with $E_A=1.2$ eV, every 10° C. rise in temperature (in the vicinity of T=300 K) decreases the lifetime by about a factor of 4.

Ion Compensated Electronic Gratings

To record permanent holographic gratings in photorefractive materials with extended lifetimes, the following steps are observed:

1. Volume holographic gratings are recorded and fixed in a photorefractive material such as doped $LiNbO_3$. This can be done in one of two ways:
   (a) Recording the grating by illuminating the crystal with a light interference pattern at room temperature, then heating the crystal to a temperature where ions become more mobile and move to compensate the electronic space charge pattern, as described in G. A. Rakuljic and A. Yariv, "Photorefractive Systems And Methods," U.S. patent application Ser. No. 07/908, 298 (1992), supra; or
   (b) Heating the crystal to a temperature where the ions become mobile, then illuminating the crystal with the light interference pattern to simultaneously write and fix the gratings;
2. Cooling the crystal back to room temperature. At this point, a small residual grating is present; the magnitude of this net grating is increased by changing the compositions and charge states of various impurities in the crystal.
3. By illumination with proper angle, wavelength and mode, the grating can be used to reflect light outside the photosensitivity range of the material, such as IR light>1 µm for the case of Fe-doped $LiNbO_3$.

In accordance with this invention, a small residual grating in the fixed but undeveloped hologram having a lower efficiency but long-lived holographic grating is formed and usefully employed in a variety of devices. The diffraction efficiency of this grating system, which is the net of the ionic and electronic gratings, is by its very nature smaller than that for the fixed and developed gratings which were described in V. Leyva and G. A. Rakuljic, "Fixing Method For Narrow Bandwidth Volume Holograms In Photorefractive Materials," U.S. Pat. No. 5,335,098 (1994), and G. A. Rakuljic and A. Yariv, "Photorefractive Systems And Methods," U.S. patent application Ser. No. 07/908,298 (1992), supra. However, this new grating scheme, which will be referred by the descriptive term "compensated grating" (because the grating has the form of an ion-compensated electronic distribution), provides the maximum possible grating lifetime over the fixed and developed gratings prepared according to previous procedures. In these previous applications, the utility of this compensated grating to meet long lifetime requirements was not considered feasible. Compensated grating reflectivities of up to 7% have been observed in certain $LiNbO_3$ crystals, although more typical values are 1 to 2% in the materials currently being used. Diffraction efficiencies of up to few tens of percent are projected for currently available materials. These efficiencies are sufficient for applications such as wavelength monitors and filters for laser wavelength control as described later in this application and in G. A. Rakuljic et al., "Wavelength Stabilized Laser Sources Using Feedback From Volume Holograms," U.S. patent application Ser. No. 08/122,711 (1993).

This long lifetime for compensated gratings is realized because of the unique feature of having a dual electron/ion grating and its application in a system where the grating is exposed only to illumination outside the wavelength range at which the crystal is photo-excitable, such as the infrared (IR) range. The equilibrium that exists in this two-bodied system, with both electrons and ions, works to maintain the charge distribution over long periods of time. In contrast, for the case of a single charge species, the distribution is subject to dielectric relaxation. For compensated gratings, lifetimes (defined as the time required for the grating reflectivity to drop by 3 dB or some other specified amount) of greater than 100 years at room temperature have been measured using data projected from elevated temperature decay measurements. These results show lifetimes that are orders of magnitude greater than those of holograms recorded in photorefractive crystals using previously described methods.

One new preferred example for recording volume holographic gratings in photorefractive materials, i.e. "compensated gratings", allows the maximum possible grating lifetimes due to interactions between the electronic and ionic gratings to extend the lifetime of the overall system. The waveforms depicted in FIGS. 1A and 1C both illustrate single species charge distributions, where the charge carriers are under repulsive electrostatic forces which tend to diffuse the pattern until the equilibrium state is reached, i.e. with a uniform charge distribution. Although these relaxation times can be very long compared to the writing time, especially in low conductivity materials at low temperatures, the gratings will eventually decay given sufficient time.

However, in the situation shown in FIG. 1B, the ions are stabilized by the electrostatic force from the electrons. Ionic diffusion accounts for the small net space charge field, resulting in lower efficiency gratings than if the holograms are fully developed. However, the lifetimes of such gratings can be anticipated to be long, triggered only by the occasional thermal excitation of electrons and the corresponding decay of the ionic grating. For the gratings to be kept in this state, they cannot be illuminated with visible light; however, these gratings will suffice for IR readout since the material is not photosensitive and therefore the photoexcited electronic distribution will not be perturbed. This two-species system, where both the ionic and electronic gratings mutually stabilize each other, is the basis for long-lived gratings for use in IR applications.

Grating Recording and Storage Dynamics

Figure 2:
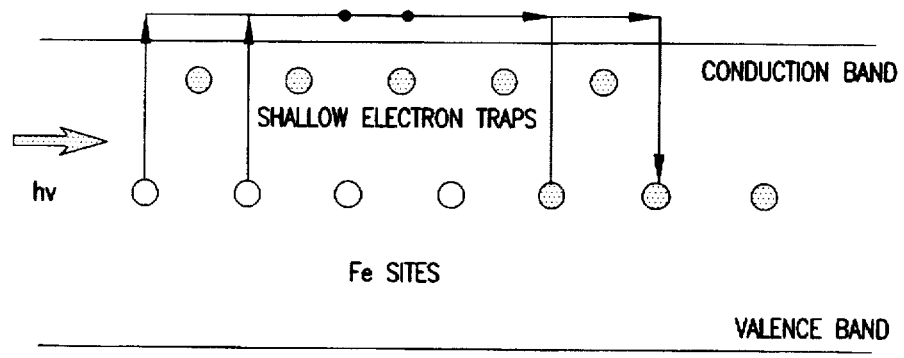
FIG. 2 is an idealized diagrammatic representation of donor sites and electron traps in the conduction band in photorefractive materials such as $LiNbO_3$.

In photorefractive materials, the photosensitive species (electrons) are excited out of their donor sites and into the conduction band in the presence of light, as shown in FIG. 2. These electrons will drift and diffuse until they are retrapped, eventually collecting in the low intensity regions in the material. In this way, a distribution of electrons with the same spatial modulation as the optical interference pattern is obtained. This in turn results in a spatially modulated space charge field, which generates an index variation in the material.

The basic equations describing the photorefractive processes in materials such as $LiNbO_3$ are derived from those formulated by N. V. Kukhtarev, et al. Using the first order Fourier expansions of the distribution functions for mobile electrons $n_e$, ion density $n_i$, and trapped charge (i.e. ionized donor) density $N_d^+$, which are given by $$n_e = n_{e0} + (n_{e1} e^{-iKx} + c.c.) \tag{2a}$$

$$n_i = n_{i0} + (n_{i1} e^{-iKx} + c.c.) \tag{2b}$$

$$N_d^+ = N_{d0}^+ + (N_{d1}^1 e^{-iKx} + c.c.) \tag{2c}$$

and the space-charge field $$E = E_0 + (E_1 e^{-iKx} + c.c.), \tag{3}$$

where $$E_1 = \frac{ie}{\epsilon K}(N_d^+ n_{i1} - n_{e1}), \tag{4}$$

gives the linearized transport equations $$\frac{\partial N_{d1}^+}{\partial t} = -A \frac{N_d}{N_A} N_{d1}^+ - \gamma_e N_A n_{e1} \tag{5a}$$

$$\frac{\partial n_{e1}}{\partial t} = \left( -A \frac{N_d}{N_A} + \frac{\mu_e n_{e0} e}{\epsilon} + i \frac{\kappa \sigma I_0 K}{e} \right) N_{d1}^+ - \tag{5b}$$

$$\left( \gamma_e N_A + \frac{\mu_e n_{e0} e}{\epsilon} + D_e K^2 + i \mu_e K E_0 \right) n_{e1} + \frac{\mu_e n_{e0} e}{\epsilon} n_{i1}$$

$$\frac{\partial n_{i1}}{\partial t} = -\left( \frac{\mu_i n_{i0} e}{\epsilon} + D_i K^2 + i \mu_i K E_0 \right) n_{i1} + \tag{5c}$$

$$\frac{\mu_i n_{i0} e}{\epsilon}(n_{e1} - N_{d1}^+).$$

In the above equations, the total current is given by the following sum:

$$j = e \mu_e n_e E + kT \mu_e \frac{\partial n_e}{\partial x} + e \mu_i n_i E + kT \mu_i \frac{\partial n_i}{\partial x} + \kappa \sigma (N_d - N_d^+) I_0, \tag{6}$$

and $A \equiv (\sigma/h\nu I_0 = \beta)$, where $I_0$ is the average (i.e. dc) optical intensity, $\sigma N_d^+$ is the absorption coefficient (in units of $m^{-1}$), $\nu$ is the optical frequency, and $\beta$ is the thermal excitation rate (in units of $sec^{-1}$).

Figure 3:
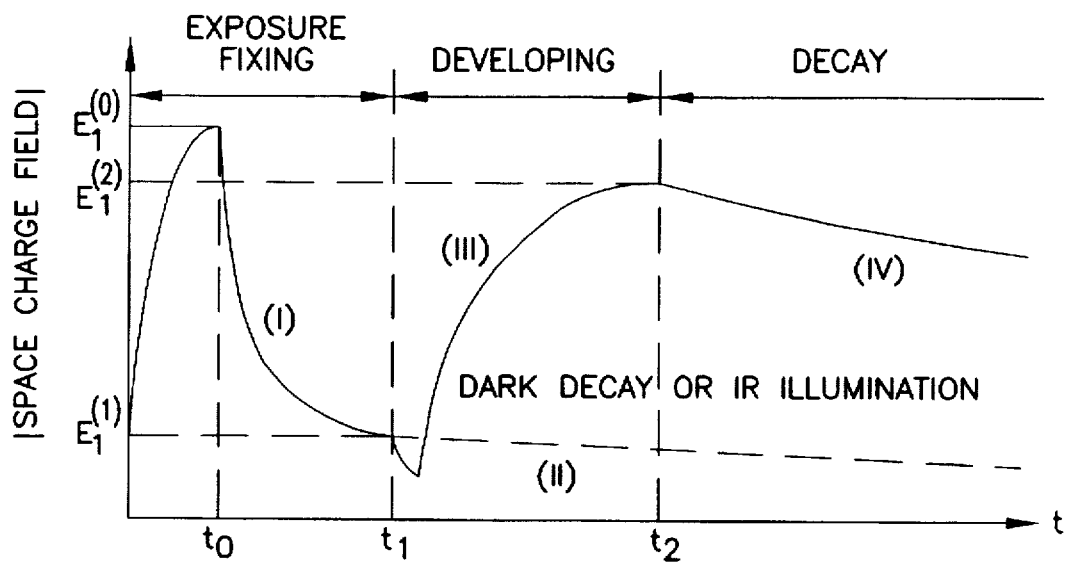
FIG. 3 illustrates the time evolution of the effective space charge field in the crystal from exposure to decay of the grating after fixing.

FIG. 3 shows the evolution of the effective space charge field in a photorefractive crystal in successive phases from exposure through to decay of the fixed grating. The phases of the process described in the following sections are denoted by the following superscripts: (I) Fixing (compensation of the electronic grating by ions, (II) Decay of the compensated grating in the dark (or IR illumination), (III) Developing to reveal the ionic grating, and (IV) Decay of the fully developed grating under continuous illumination.

Unfixed (Electronic) Grating

This is the case described by FIG. 1A, where only a photosensitive grating (comprised of electrons) is recorded in a photorefractive crystal. During the recording step, the crystal was illuminated by a spatially varying optical field, which caused electrons to collect in traps in regions of low light intensity. This generates a spatially varying electric field that follows the light interference pattern, which in turn forms an index grating.

Once the optical field is removed, few electrons are in the conduction band, so the electrons remain trapped, except for slow diffusive decay. This results from the net repulsive field (due to the electrons or ions being packed in close proximity to each other) that tends to reduce the grating to a uniform distribution. Although this diffusive decay process is slow in the dark (especially at lower temperatures), prior assumptions that neglected this effect were incorrect.

Another effect that results in decay of the space charge field after the gratings are written is drift of the ions to compensate the electronic grating, which partially screens the electronic space charge field. This is the same process which is used at high temperature to fix the gratings, although it is much slower at room temperature. As a result of this process, the gratings will be observed to decay (slowly) as the compensating ionic grating builds up.

At this point in the discussion, one must consider the dominant charge carriers for various conditions, as shown by the temperature-dependent electronic and ionic conductivities. Although $LiNbO_3$ is essentially an insulator (with at least an order of magnitude higher resistivity that sapphire), its bulk conductivity still plays a significant role in grating decay. The following describes the relationship between the ionic and electronic conductivities in this detailed description:

Under illumination, large numbers of electrons are excited into the conduction band, so electronic conductivity will be high and the electrons are free to move within the crystal.

When the crystal is in the dark, there are few electrons present in the conduction band—therefore, ionic conductivity dominates over electronic conductivity. The ionic conductivity increases with temperature increase, allowing fixing to occur.

Figure 4:
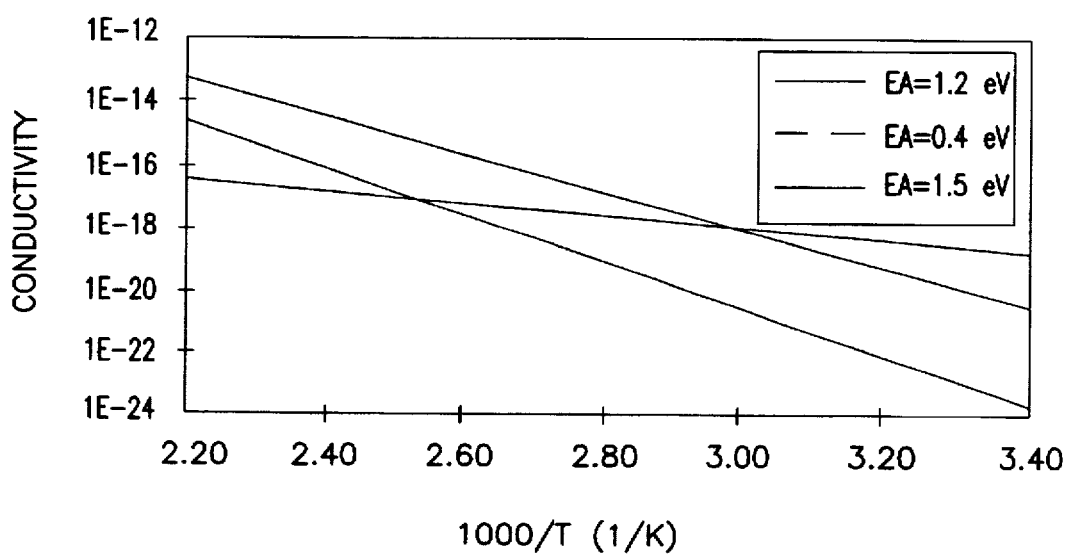
FIG. 4 is a plot showing the relationship between conductivities of ions, electrons trapped at $Fe^{2+}$ centers, and shallow trap electrons.

In some crystals, thermal diffusion of electrons has been observed at lower temperatures (i.e. generally below 70° C.). This is attributed to electrons in shallow traps, where their room temperature conductivities are higher than that of ions. Although the electronic conductivity due to shallow traps may dominate at lower temperatures, ionic conductivity will dominate at higher temperatures due to the higher activation energy of the ions as shown in FIG. 4. The rigorous theoretical description in the following sections assumes that ions are the sole mobile species in the absence of light, with electrons trapped at the $Fe^{3+}$ sites assumed to be immobile relative to ionic transport. Unless otherwise noted, the contribution of shallow trap electrons is neglected in the following models.

Compensation of Electronic Space Charge Field

For this stage, the crystals are heated to a temperature at which the non-photosensitive ions become mobile in "realtime" so they move to compensate the electronic space charge field. With $LiNbO_3$, this temperature has been found (through experimentation) to be in the 140° to 200° C. range, depending on the physical parameters of the crystal. In the "simultaneous writing and fixing" method, where gratings are written in the crystal at elevated temperatures, this compensation process occurs concurrently with the formation of the electronic space charge field.

Regardless of the electronic vs. ionic conductivities at room temperature, the ions become more mobile than electrons at temperatures above approximately 100° C. and move within the crystal to compensate the spatial distribution of the optically trapped electrons at a rate faster than diffusive decay of the electronic grating. Because of diffusion, the compensation is incomplete and a small residual net grating remains; for perfect compensation of the electronic grating (corresponding to zero diffusion), this net space charge field will be zero in steady state. The advantage of this method is that beam coupling from the buildup of a strong electronic grating is minimized because the grating is immediately compensated.

The space charge field for this process, obtained through the solution of Kukhtarev's equations, is given by $$E_1^{(1)}(t) = E_1^{(0)}(0) \left[ \frac{D_i K^2 + iK\mu_i E_0}{\omega_i + D_i K^2 + iK\mu_i E_0} + \frac{\omega_i}{\omega_i + D_i K^2 + iK\mu_i E_0} e^{-(\omega_i + D_i K^2 + iK\mu_i E_0)t} \right] \quad (7)$$

where $\omega_i$ is the dielectric relaxation frequency and $D_i$ is the ionic diffusion coefficient given by $$D_{i,e} = \mu_{i,e} \frac{k_B T}{e} \quad (8)$$

where $k_B$ is Boltzmann's constant, T is the temperature, and $\mu$ is the mobility, with the subscripts i denoting ions and e denoting electrons. The characteristic time constant for this process is given by $$\tau_1 = (\omega_i + D_i K^2 + iK\mu_i E_0)^{-1} \quad (9)$$

where $\omega_i = (e\mu_i n_{i0}/\epsilon)$, the ionic relaxation frequency.

A key parameter for device applications is the magnitude of the compensated grating, which is the result of diffusion causing incomplete compensation. By its very nature, the net space charge field of the compensated state will be considerably less than that of the initial (electronic) grating. The steady-state value of the effective space charge field is obtained from Eqn. (7) and is given by $$E_1^{(1)} = \frac{D_i K^2 + iK\mu_i E_0}{\omega_i + D_i K^2 + iK\mu_i E_0} E_1^{(0)} \quad (10)$$

where $E_1^{(0)}$ is the space charge field before compensation. Note that for $D_i = 0$ and no applied electric field, the steady state solution is zero; otherwise, there is a small residual field which is the compensated grating.

The ratio $E_1^{(1)}/E_1^{(0)}$ from Eqn. (10) is an important factor in applications of compensated gratings, giving the effective magnitude of the long-lived compensated grating. For $E_0=0$, this is given by $$\frac{E_1^{(1)}}{E_1^{(0)}} = \frac{1}{1 + \frac{e^2 n_{i0}}{\epsilon k_B T K^2}} \quad (11)$$

To increase the compensated grating amplitude, the ionic relaxation frequency must be reduced, which requires that $n_{i0}$ be reduced to provide only a sufficient concentration of ions for compensating the grating.

Compensated and Undeveloped Gratings

Unlike the case of the electronic or ionic grating by itself, the combination of ionic and electronic gratings in the system just described has very long lifetimes, even at high temperature. Because the system is in charge equilibrium, the combination grating system has very slow decay rates, and can be used advantageously in a number of applications where long-lived gratings are essential. In the following analysis, the effects of charges (i.e. electrons) in shallow traps is neglected.

At this point, the grating is kept in the dark so only thermal decay is present. Ionic conductivity is assumed to be dominant; therefore, decay of the two-bodied system is clamped to that of the slower electronic decay. This decay process occurs when an electron is occasionally thermally excited, and it proceeds to drift and diffuse out of the grating because of Coulombic repulsion. A corresponding ion will then follow the electron, since the electronic grating is acting as a "backbone" to hold the ionic grating in place. This results in an irreversible loss in the grating amplitude. However, this process is slow due to the two-bodied nature of this process and is driven only by the thermal decay time of electrons.

The decay process for the two-bodied grating system in the dark is governed by the equilibrium condition $$\frac{n_{i0}}{N_{II}^+} = -\frac{\omega_i}{\omega_i + D_i K^2 + iK\mu_i E_0} . \quad (12)$$

The space charge field decay (i.e. grating amplitude) goes as $$E_1^{(II)}(t) = \frac{ie}{\epsilon K} (N_{II}^+(t) + n_{i1}(t)) = \quad (13)$$

$$E_1^{(0)} \frac{D_i K^2}{\omega_i + D_i K^2} \exp\left[ -\omega_e \left( \frac{D_i K^2}{D_i K^2 + \omega_i} + K^2 d^2 \right) t \right]$$

where $$\omega_e = \frac{e\mu_e n_{e0}}{\epsilon} = \frac{e\mu_e A(N_d - N_A)}{\epsilon \gamma_e N_A} \quad (14a)$$

and $$d^2 = \frac{A N_d D_e}{\gamma_e N_A^2 \omega_e} . \quad (14b)$$

Figure 5A:
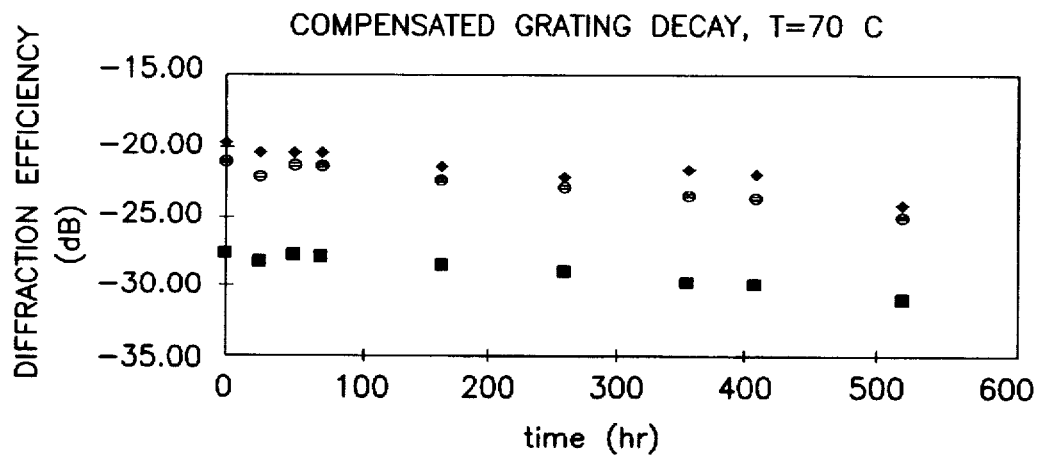
FIGS. 5A and 5B, comprising separate plots, show the slow decay of an electronic grating stabilized with a compensating ionic grating under different time and temperature conditions.
Figure 5B:
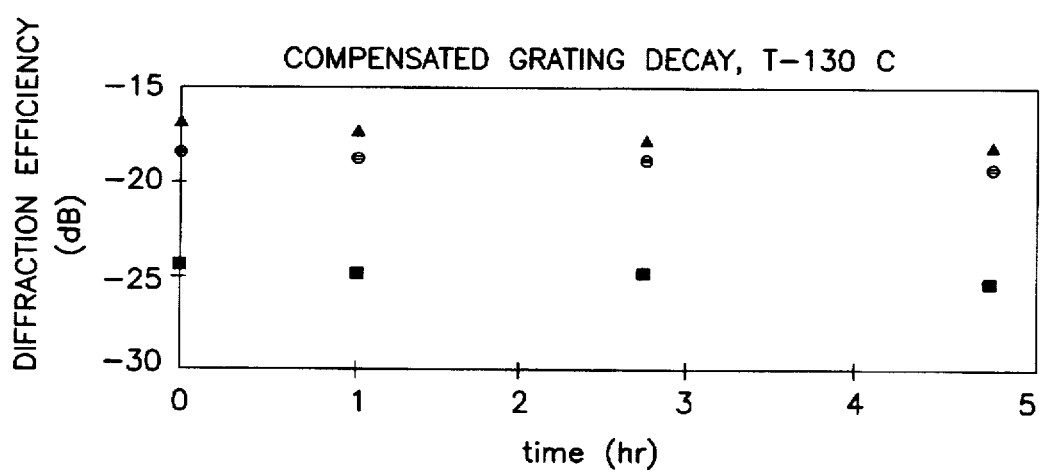

Note that the overall decay time, which is given by $$\tau_{II} = \left[ \omega_e \left( \frac{D_i K^2}{D_i K^2 + \omega_i} + K^2 d^2 \right) \right]^{-1} , \quad (15)$$

is clamped to the time constant for electronic relaxation, which is the slower of the two decay processes. FIGS. 5A and 5B illustrate the decay rates of compensated gratings at different temperatures, in FIGS. 5A and 5B.

If the hologram is illuminated with light, the gratings will begin to be developed beyond its equilibrium state and this compensated condition is violated. Therefore, devices using these compensated gratings must be kept in the dark; any readout with photo-ionizable light will shorten the lifetime of this grating. This appears to limit the usefulness of these gratings despite their lifetime improvements. However, in the case of infrared readout, i.e. gratings Bragg-matched to reflect in the IR outside the photosensitivity range of the material (cf. V. Leyva, G. A. Rakuljic, B. O'Conner, *Appl. Phys. Lett.* (1994)), these gratings will not be affected by the readout light and therefore can be used in these applications.

Developed Gratings

In the previous method for fixing gratings, the holograms were developed after fixing to reveal (as much as possible) the ionic grating, resulting in high diffraction efficiencies. In the case of the compensated gratings just described, lower efficiency but long-lived gratings are obtained because the electronic grating is mostly screened by the ions. If higher efficiencies are necessary for their particular application, the grating must be developed to expose the non-photosensitive ionic space charge distribution. However, since the system will now be out of equilibrium (from the compensated grating case), these gratings will tend to decay at a faster rate.

During development, the crystal is illuminated with light to remove the electronic grating, leaving only the non-optically sensitive ionic grating. Upon illumination, the electrons are excited into the conduction band, allowing them to move with high mobility so the electronic conductivity becomes much greater than that of the ions. With materials such as $LiNbO_3$, which are photovoltaic, the cases of open and short circuited development result in different solutions, so both must be considered. For the open circuited case, the steady state current is zero, so an internal photovoltaic field builds up in the crystal, which is given by $$E_o = \frac{\kappa\alpha I_0(N_d - N_a)}{e\mu_e n_{e0}} \equiv -E_{PV} \quad (16)$$

and must be included in 5(a)–5(c). The resulting space charge field in the crystal is given by $$E_1^{(III)}(t) = \frac{ie}{\epsilon K} \left\{ \frac{\omega_1 - \omega_2}{\omega_1} n_{i1}(t_1) + \left[ N_{i1}^+ + \frac{\omega_2}{\omega_1} n_{i1}(t_1) \right] e^{-\omega_1 t} \right\} \quad (17)$$

where $$\omega_1 \equiv \omega_e \left[ \frac{1 + K^2 d^2 + i\frac{E_{PV}}{E_q} \left[ \frac{N_d - N_a}{N_d} \right]}{1 + K^2 r_d^2 + iKr_{PV}} \right] \quad (18a)$$

$$\omega_2 \equiv \frac{\omega_e}{1 + K^2 r_d^2 + iKr_{PV}} \quad (18b)$$

$$d^2 \equiv \frac{AN_dD}{\gamma_e N_a^2 \omega_e} = \frac{kT\epsilon}{e^2 N_a \left(1 - \frac{N_a}{N_d}\right)} \left( K^2 d^2 = \frac{E_d}{E_q} \right) \quad (18c)$$

$$r_d^2 \equiv \frac{D}{\gamma_e N_a}, \quad (18d)$$

$$E_q = \frac{eN_a}{K\epsilon} \left(1 - \frac{N_a}{N_d}\right), \quad (18e)$$

$$E_d \equiv \frac{D_e K}{\mu_e} = \frac{k_B T K}{e}, \quad (18f)$$

and $$r_{PV} = -\frac{\mu_e E_{PV}}{\gamma_e N_a} \quad (18g)$$

At the end of the illumination process, the space charge field is given by $$E_i^{(2)} = \frac{ie}{\epsilon K} n_{i1}(t_1) \frac{\omega_1 - \omega_2}{\omega_1}. \quad (19)$$

Note that Eqn. (19) is independent of the initial trapped charge grating $N_{d1}^+$. This field approaches the value of the original electronic space charge field $E_1^{(O)}$ when $n_{i1}(t_1) \approx -N_{d1}^+(t_o)$ and $|\omega_1| \gg |\omega_2|$, which is satisfied for complete ionic compensation and when $E_d/E_q \gg 1$ or $E_{PV} \gg E_q$.

For the short circuit case, the photovoltaic current flows but $E_o = 0$, $r_{PV} = 0$, and Eqn. (18a) is now given by $$\omega_1 \equiv \omega_e \left[ \frac{1 + K^2 d^2 + i\frac{E_{PV}}{E_q} \left( -\frac{N_a}{N_d} \right)}{1 + K^2 r_d^2 + iKr_{PV}} \right]. \quad (18a)$$

Otherwise, the developed space charge field is as given in Eqn. (19).

Figure 6:
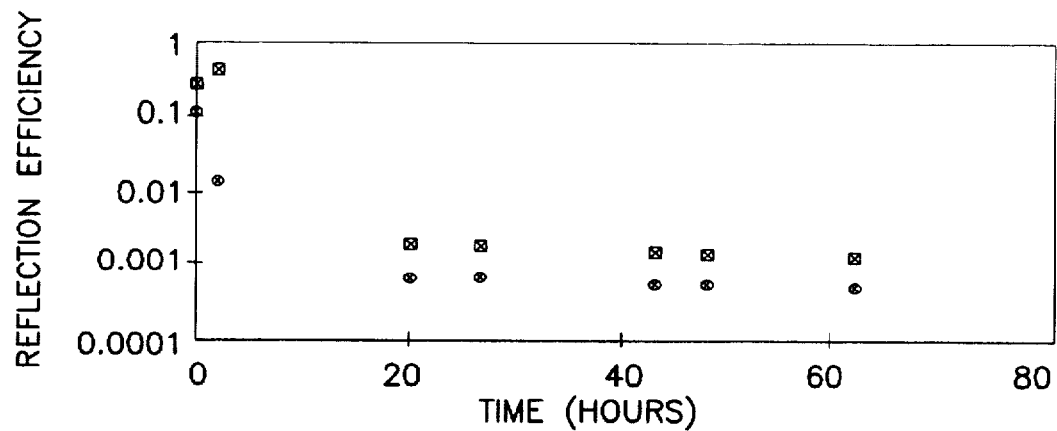
FIG. 6 is a plot of the diffraction efficiency vs. time for developed gratings, showing the rapid initial decay due to compensation of ions by electrons in shallow trapping sites.

In some $LiNbO_3$ crystals, the developed grating has been observed to decay in the dark over a period ranging from days to weeks, as shown in the plots of FIG. 6. This process has been attributed to compensation by electrons in shallow traps, which are shown in schematic form in FIG. 2. Because of Coulombic attraction, these electrons are driven to the spatial sites with high ionic concentrations. Re-developing the crystal by exposing it again to light has successfully returned these gratings to their original conditions by redistributing these thermally excited electrons.

Decay of Developed Grating Under Continuous Illumination

In the example illustrative of use of the developed holographic grating, i.e. when high diffraction efficiencies are required, the grating is to remain continuously illuminated during operation. Regardless of the relative conductivities between electrons and ions at room temperature, under illumination electrons flood into the conduction band so the electronic conductivity is much higher than that of the ions. Therefore, the ionic rating now forms the "backbone" with the electronic grating acting as the compensating species. The presence of the electronic grating as the compensating field clamps the decay to the slower of the two processes, which is now ions. This equilibrium condition is given by $$N_{i1}^+(t) = -\frac{\omega_2}{\omega_1} n_{i1}(t). \quad (20)$$

For the open circuited case, the space charge field is given by $$E_1^{(IV)}(t) = \frac{ie}{\epsilon K} \left( \frac{\omega_1 - \omega_2}{\omega_1} \right) n_{i1}(t_1) \exp\{-[\omega_i(1 - \omega_2/\omega_1) + D_i K^2 + i\mu_i K E_{PV}]t\}, \quad (21)$$

and the space charge field for the short circuited case is given by $$E_1^{(IV)}(t) = \frac{ie}{\epsilon K} \left( \frac{\omega_1 - \omega_2}{\omega_1} \right) n_{i1}(t_1) \exp\{-[\omega_i(1 - \omega_2/\omega_1) + D_i K^2]t\}. \quad (22)$$

Note that $\omega_1$ and $\omega_2$ have different definitions depending on whether they are for the short or open circuited cases. Therefore, the time constants for this process are given by $$\tau_{IV}^{(open)} = \left[ \omega_i \frac{K^2 d^2 + i\frac{E_{PV}}{E_q}\left(1 - \frac{N_a}{N_d}\right)}{1 + K^2 d^2 + i\frac{iE_{PV}}{E_q}\left(1 - \frac{N_a}{N_d}\right)} + D_{iK}^2 + i\mu_i K E_{PV} \right]^{-1} \quad (23a)$$

$$\tau_{IV}^{(short)} = \left[ \omega_i \frac{K^2 d^2 - i\frac{E_{PV}}{E_q}\left(\frac{N_a}{N_d}\right)}{1 + K^2 d^2 - i\frac{E_{PV}}{E_q}\left(\frac{N_a}{N_d}\right)} + D_i K^2 \right]^{-1}. \quad (23b)$$

Therefore, applications of high efficiency gratings which require developed gratings should be continuously illuminated for maximum possible lifetime. This decay is clamped to the ionic relaxation time, which is faster than the thermal decay time of electrons in the dark. Therefore, the decay of the illuminated, fully developed grating will fundamentally be less than that of the undeveloped, compensated grating. Although the results of this section show that ionic grating lifetime can be increased by decreasing the ionic conductivity, there are practical material limitations on the minimum conductivity of ions.

Illumination of the developed grating also addresses another transient decay phenomenon that has been observed with some $LiNbO_3$ crystals. Fixed and fully developed gratings have been observed to have a relatively fast apparent decay of the net grating at around room temperature.

However, this decay process was reversible by re-illumination of the grating, indicating that it is electron-based. This phenomenon was attributed to shallow trap electrons moving to compensate the exposed ionic grating, with the process characterized by low activation energy (on the order of 0.4 eV). The low activation energy results in a shallow temperature slope, so at high temperature the decay of ions or electrons trapped in the $Fe^{2+}$ sites will dominate. Continuous illumination, however, will maintain the developed state by photoexciting all electrons, clamping the decay rate to the modified ionic relaxation frequency $$\frac{1}{\tau} = \omega_i \left(1 - \frac{\omega_2}{\omega_1}\right) + D_i K^2. \quad (24)$$

Figure 7:
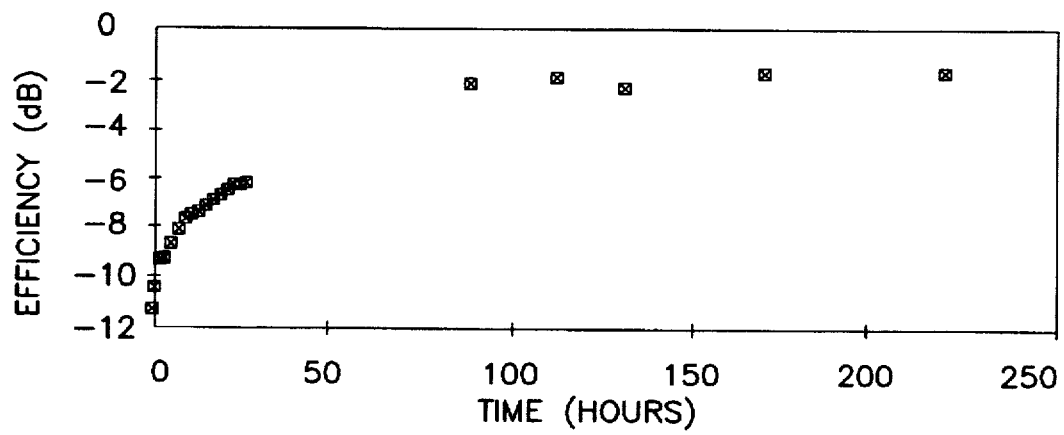
FIG. 7 is a plot of grating efficiency versus time, showing the result of developing a fixed grating using a light emitting diode to erase the electronic grating, demonstrating the practicality of using it as an efficient, low power illumination source for this process.

For visible wavelength gratings, the readout light will serve to maintain the necessary illumination during use. Examples of this application include holographic narrow bandwidth filters and optical data storage, where the operating wavelength of the device is within the photosensitivity range of the material. For devices which will see only intermittent use and long dark storage, and for gratings in the infrared, an external illumination source is used to maintain the developed condition. The optical power flux from low power sources such as a light emitting diode has been demonstrated to be sufficient in most cases, as shown in FIG. 7.

Method in Accordance with the Invention

Compensated Grating

In order to fabricate holographic gratings for long-lifetime applications, gratings are recorded in specially prepared $LiNbO_3$ crystals using the following steps:

- The crystal is shorted across the c-axis and heated in a vacuum oven to the fixing temperature, usually around 200° C. and allowed to stabilize;
- Writing beams from a laser are directed into the crystal to write a holographic grating with the desired reflection wavelength and angle, and this process is repeated for additional wavelengths to be multiplexed in the same crystal;
- The crystals are quickly cooled to room temperature without exposing to any additional light;
- After this process, the magnitude of the space charge field for the compensated grating continues to increase slowly over several days at room temperature—this process is allowed to continue until the grating builds up to near its peak;
- The crystals containing the compensated gratings are installed in the package without any significant additional exposure to visible light;

These crystals have been subject to post-growth annealing and chemical treatments to adjust their impurity valence states to optimize their fixed grating efficiencies. The operation of these gratings is limited to applications where they would be illuminated only by infrared light beyond the photosensitivity limit of these materials. In addition, intermittent illumination at low light intensities, where the cumulative incident energy density is negligible, may also be used with compensated gratings where specifications permit.

In some cases, pre-baking the crystal in the dark after exposure at about 100° C. for several hours has resulted in increased coupling constant of the compensated grating. This procedure accelerates the normal relaxation process that lasts for several days at room temperature as the electron/ion grating ratio changes toward the new equilibrium condition at the new temperature. The addition of this step allows the crystals to be used in their final application more quickly than waiting for the system to reach steady state on its own. It also allows any accumulated internal dc charge (from rapid heating and cooling of the crystal) to dissipate prior to use.

High Efficiency Gratings

For gratings where high efficiencies are required, the grating must be developed as described in V. Leyva and G. A. Rakuljic, "Fixing Method For Narrow Bandwidth Volume Holograms In Photorefractive Materials," U.S. Pat. No. 5,335,098 (1994), supra, with the result that the grating lifetime will be significantly shorter than that for the compensated grating. However, the lifetime of the developed grating can be extended to the maximum possible by following the following steps arising from the theoretical discussion:

1. Holographic gratings are recorded and fixed in the crystal using the methods described in V. Leyva and G. A. Rakuljic, "Fixing Method For Narrow Bandwidth Volume Holograms In Photorefractive Materials," U.S. Pat. No. 5,335,098 (1994), supra;
2. The grating is developed by exposing the crystal to light (at a wavelength or wavelength range suitable for photoexciting carriers into the conduction band of the crystal) for a period of time sufficient to reduce the electronic grating magnitude so the net space charge field results in the desired grating efficiency;
3. Applying continuous illumination of such light to the crystal during use, either from the incident light from the application or a dedicated source illuminating the crystal continuously.

Continuous illumination also addresses another problem that has been observed with some crystals with high efficiency, developed gratings. During storage in the dark, electron-based compensation and screening of the ionic space charge field has been observed. In accordance with the best theoretical model, this phenomenon is attributed to electrons from shallow traps (i.e. $Nb^{5+}$ centers in the crystal lattice) being thermally excited and moving to compensate the strong ionic field. This screening space charge distribution is removed by maintaining exposure to light, so the electrons diffuse into a uniform distribution so the high net space charge field is maintained.

Experimental Results

The procedure described in the previous section was used to fabricate compenated holographic gratings in various samples of $LiNbO_3$, where visible (488 nm) light as incident through the side faces of the crystal to write a grating for retro-reflection at around 1.5 µm. These crystals were kept in the dark or subject only to IR illumination to avoid undesired photo-excitation of electrons or development of the gratings. The decay times of the resulting compensated grating was measured at various temperatures to obtained decay rate predictions.

FIGS. 5A and 5B illustrate diffraction efficiency decay at different temperatures for some $LiNbO_3$ crystals with compensated gratings. By measuring the change in decay time constants with temperature, the activation energy is obtained. This enables the decay rate to be projected to lower temperatures according to $$\frac{\tau(T)}{\tau(T_0)} = \exp\left[-\left(\frac{E_A}{k_B}\right)\left(\frac{1}{T} - \frac{1}{T_0}\right)\right] \quad (25)$$

Figure 8:
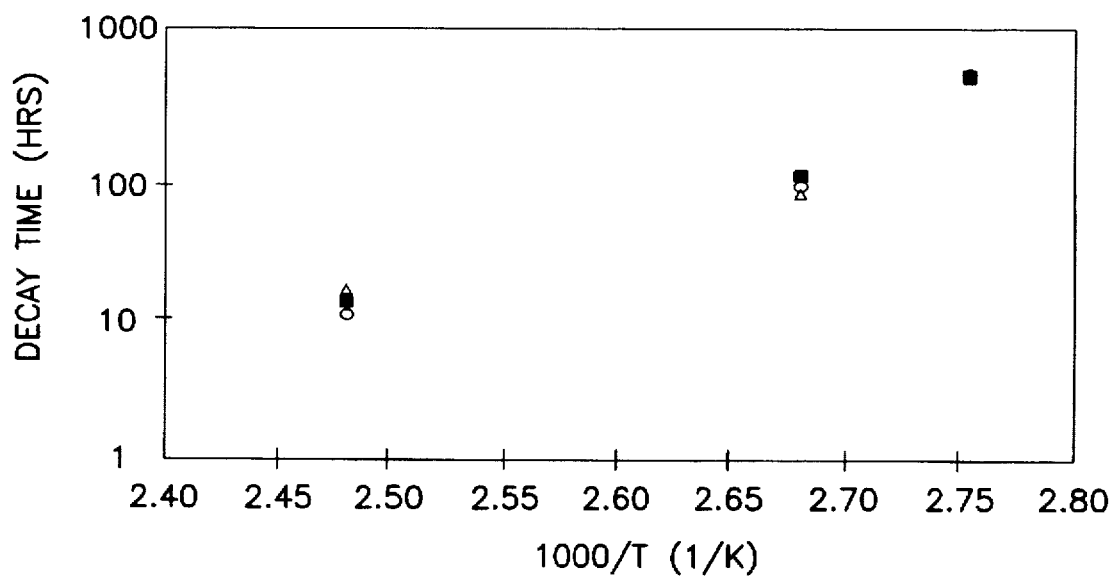
FIG. 8 is a logarithmic plot of the decay times as a function of 1/T.

FIG. 8 is a logarithmic plot of some measured decay constants of compensated gratings in $LiNbO_3$ as a function of temperature. By projecting these decay rates down to 25° C. based on the data obtained at higher temperatures, lifetimes on the order of $10^2$ years are obtained.

Wavelength Monitor/Locker

Figure 9:
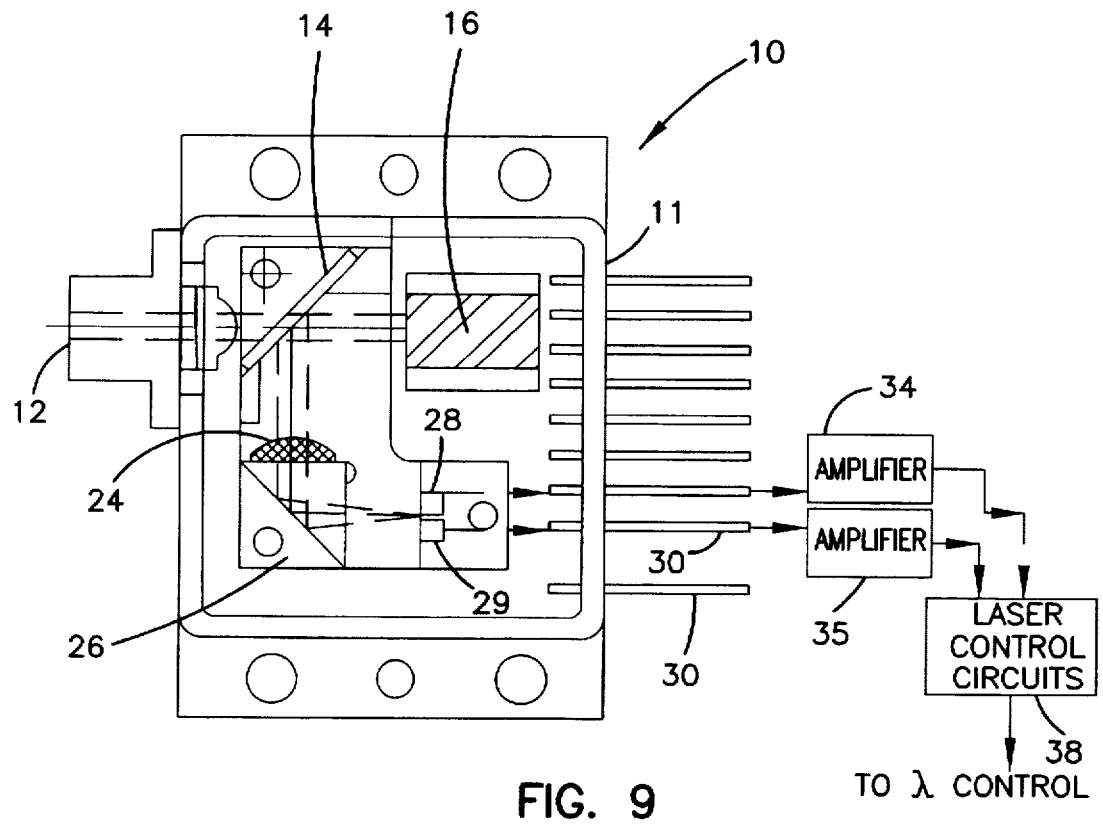
FIG. 9 is a top view of a wavelength monitor/locker for monitoring or controlling the output wavelength of a laser such as for wavelength division multiplexed (WDM) optical transmitter.
Figure 10:
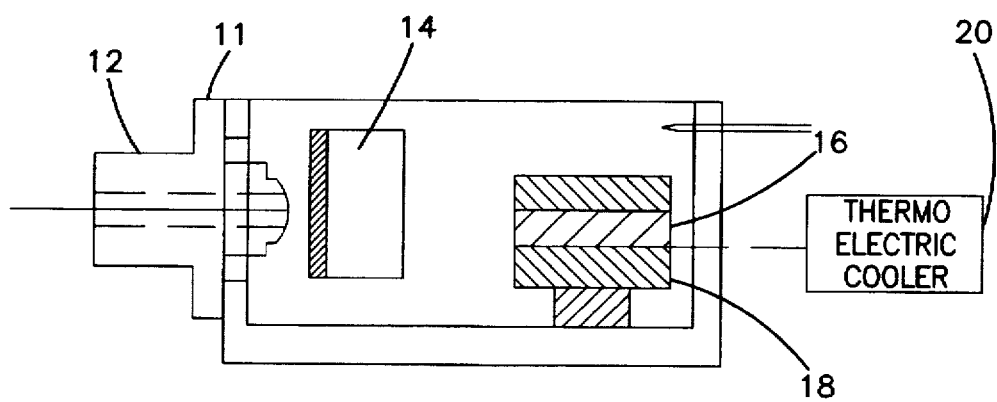
FIG. 10 is a side sectional view of the device of FIG. 9.

The compensated gratings cannot produce the high diffraction efficiencies of fully developed gratings, but are well suited for a number of applications where the operative light is in the infrared wavelength band. FIG. 9 is a top view, and FIG. 10 is a side sectional view, of a device for one such installation, this being a wavelength monitoring or locking device for optical transmitters and lasers, such as those used in multi-wavelength optical communication systems. At these wavelengths for telecommunications (1.3 or 1.55 µm), the operating light cannot photo-excite electrons in the crystal, which is necessary to avoid degradation of the compensated grating. Next, dependent upon the manner in which the output signals are used, the wavelength of the source can be controlled, or monitored to assure that it is within a preselected band.

In the wavelength monitoring or locking device 10, illustrated in FIGS. 9 and 10, the operative units are disposed within a housing 11 which is enclosed (apart from the input port), the cover of the housing 11 not being shown. The input 12 is coupled to receive incident light at an IR wavelength, as from an optical waveguide coupler (not shown). The light is directed through an angled dichroic mirror 14 onto a photorefractive crystal 16 having, in this example, a pair of compensated holographic gratings, each recorded to reflect a different narrow band wavelength of light at a slightly different angle back off the beam splitting mirror 14. The wavelengths are spaced apart by only a selected amount, usually in the Angstrom range. The crystal 16 is mounted on an adjustable flexure support 18, the details of which can be conventional and are not shown. However, the crystal temperature is maintained at a selected level by thermal coupling to a thermoelectric cooler 20, shown diagrammatically in FIG. 10.

Light reflected off the beam splitting mirror 14 is directed through a focusing lens 24 onto the internal face of a prism 26. If the wavelength of the light is at the chosen center frequency, there is little light reflected toward a mid point between a pair of detectors 28, 29. If the wavelength varies from the nominal, then more light is reflected toward one or the other of the detectors 28, 29. The detectors 28, 29 are each coupled through separate pin terminals 30 to different amplifiers 34, 35. The difference between the signals from the two amplifiers is generated in laser control circuits 38, and used to control the wavelength of a laser (not shown).

Each grating in the crystal 16 is set to reflect its particular wavelength at its different angle to the associated individual detector, 28 or 29. By varying the relative wavelengths of the gratings, different purposes can be met. The thermoelectric cooler 20 is utilized to stabilize the wavelengths of reflection, and to provide some temperature tuning capability.

Figure 11:
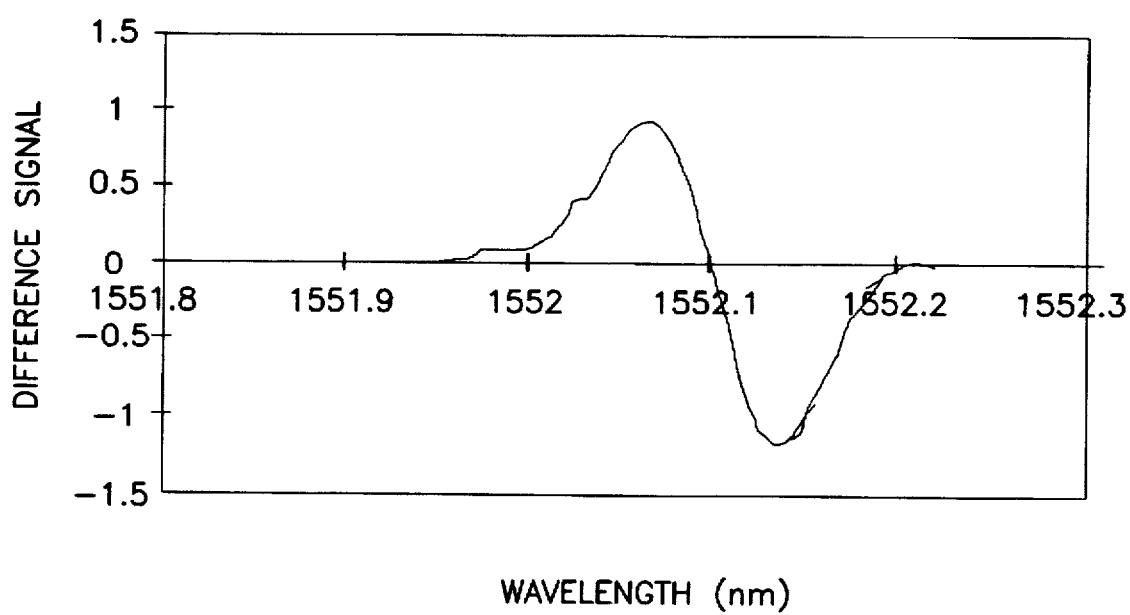
FIG. 11 is a plot of the difference signal from the crossed holographic filters in the wavelength monitor locker of FIGS. 9 and 10.

In the examples shown in FIGS. 9 and 10, the gratings may have center wavelengths offset from the operating wavelength in the "cross filter configuration" (cf. G. A. Rakuljic et al., "Wavelength Stabilized Laser Sources Using Feedback From Volume Holograms," U.S. patent application Ser. No. 08/122,711 (1993)). As seen in FIG. 11, the signals from the detector 28, 29 outputs that pass through the amplifiers 34, 35 respectively, are used to determine whether the source is at the proper wavelength and, if not, the direction and amount of deviation from that wavelength.

Other variations of this device have been realized. A single compensated grating may be used to monitor the signal of the source to determine whether its wavelength falls within the pass band of a filter for monitoring purposes. Such an arrangement provides the same information as to the two grating devices previously described, with respect to the direction of the wavelength deviation. However, if the center wavelength of the single grating is dithered, an exact wavelength reading can be obtained in accordance with known error sensing techniques.

Figure 12:
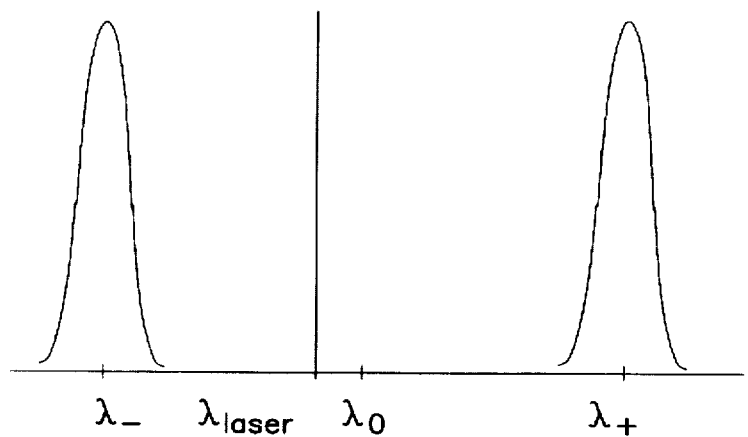
FIG. 12 is a spectral detector signal plot of a holographic grating optical network channel monitor.

Alternatively, a set of two gratings can function as a monitor for a WDM wavelength channel to signal when the wavelength has deviated outside its assigned channel limits. The spectral response of the system as a function of wavelength in this situation is shown in FIG. 12. When the transmitter is operating at its assigned wavelength, the signals from the detectors 28, 29 are zero, or effectively so. However, if the operating wavelength approaches the edge of the channel, a discernible signal appears at one of the two detectors in response to the reflected beam angle.

Optical Network Management and Monitoring

Figure 13:
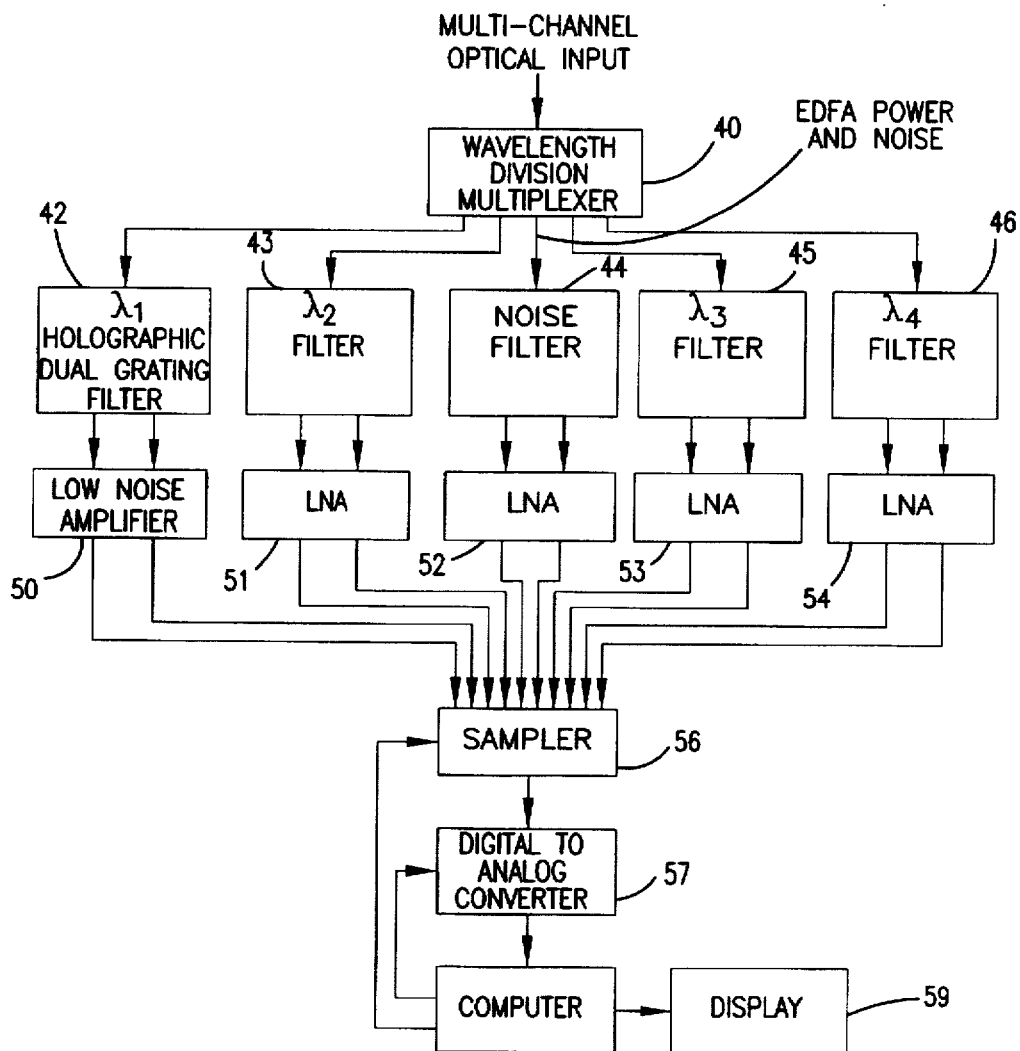
FIG. 13 is a schematic diagram of an optical network monitor such as for wavelength division multiplexed (WDM) optical telecommunications using compensated grating volume holograms.

A number of compensated grating devices similar to those shown in FIGS. 9 and 10 have been utilized in parallel in a network monitoring system, shown in FIG. 13 as a WDM test bed system. A multichannel optical input having narrow band (e.g. 2 Å wide) WDM channels is provided to a wavelength division multiplexer 40 which splits the multichannel signals into its different wavelength components, each on a separate path. One of the channels is designated as a noise channel, and receives only signals from the erbium doped fiber amplifiers which may be used in such systems. The remaining signals are designated $\lambda_1$, $\lambda_2$, $\lambda_3$, and $\lambda_4$. Each of the separate signal channels is supplied as an input to a different holographic dual grating filter 42–46, respectively, each of which provides a pair of outputs as previously described in conjunction with FIGS. 9 and 10. These outputs are amplified in low noise amplifiers 50–54, respectively, and applied in pairs to a sampler circuit 56, which may be any suitable form of time division demultiplexer that scans the incoming signals at a selected rate and applies them to a D/A converter 57 which provides corresponding digital outputs to a computer 58 having an associated display 59.

With the filters 42–46 providing output signals that indicate the variation of the separate inputs from their nominal wavelength values, the resultant sensed signals are sampled at a suitably high repetition rate in the sampler 56, and the converted digital values from the digital to analog device 57 are applied to the computer, 58, which provides a constant indication of how close the input signals are to their preferred values. At the same time, it provides an indication of variations in fiber amplifier noise. Synchronization of the sampler 56 and D/A converter 57 is controlled by the computer, which can also generate commands to be communicated for wavelength stabilization purposes.

Demultiplexers

For high diffraction efficiency devices, such as channel add/drop couplers or optical multiplexers and demultiplexers for WDM communications, the fully developed holographic grating is needed to obtained the necessary high efficiencies. In these devices, the full ionic grating has been revealed during processing by exposing the system to light to reduce the level of the photo-sensitive electronic grating. However, the grating decay rate is considerably faster than for the case of compensated gratings.

Two types of decay are expected for these gratings. In the first, thermally excited electrons from shallow trap levels move to compensate and screen the ionic grating. This process serves to reduce the net grating magnitude until the screening electrons reach an equilibrium condition. Since the characteristic activation energy is low, other decay effects will dominate at higher temperatures. This process can be reversed by illuminating the crystal (i.e. developing) until the electrons are re-distributed.

The second type of decay is due to diffusion of ions. Here, the time constant is based on the ionic relaxation time. When the ionic grating decays, the loss in coupling constant is permanent and irretrievable, unlike the previously described screening process. Under illumination, the electronic conductivity will be very large, so the electrons are free to move to compensate the ionic grating, therefore slowing down the decay rate. The net space charge field was given in Eqn. (19) and becomes very large for nearly complete ionic compensation in the fixing stage. However, since the characteristic decay time is based on ionic relaxation, which is considerably shorter than that for electrons, the grating decay rate will be faster than for compensated gratings, whose decay rates are clamped to that of the slower electronic decay rate.

In accordance with these arguments, Applicant's devices using high efficiency gratings are arranged to remain continuously illuminated during use. For visible wavelength devices such as holographic filters or optical data storage, the readout light provides this illumination. For IR devices such as telecommunications demultiplexers and add/drop couplers, this must be provided by an external source since the crystal will not respond to IR light.

Figure 14:
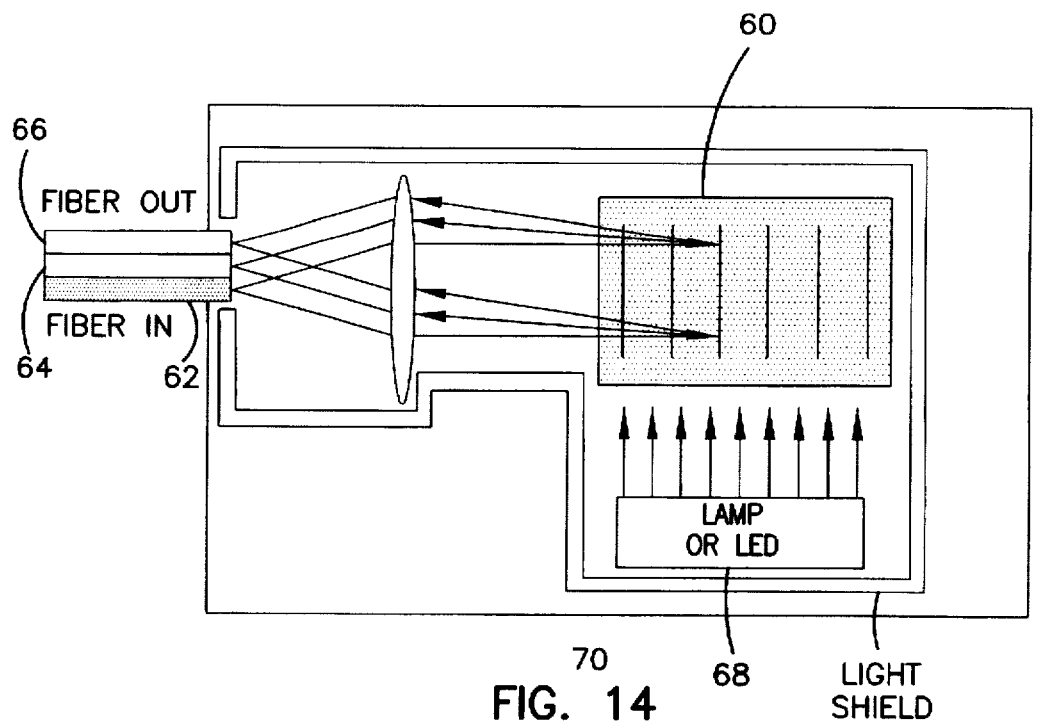
FIG. 14 is a schematic diagram of a holographic grating demultiplexer for WDM telecommunications.

A schematic diagram of a possible configuration of the device for WDM demultiplexing or add/drop coupling for WDM is shown in FIG. 14. High efficiency gratings in a crystal 60 are used to reflect each wavelength channel on an input fiber 62 into a specific direction, either to be coupled back into another fiber 64 or 66 or onto a detector (not shown). A light emitting diode (LED), visible semiconductor laser, or other suitable illumination source 68 is used to illuminate the crystal 60 continuously. A light shield 70 or similar filter means is deployed to keep the background illumination from adding to the noise in the signal.

Figure 15:
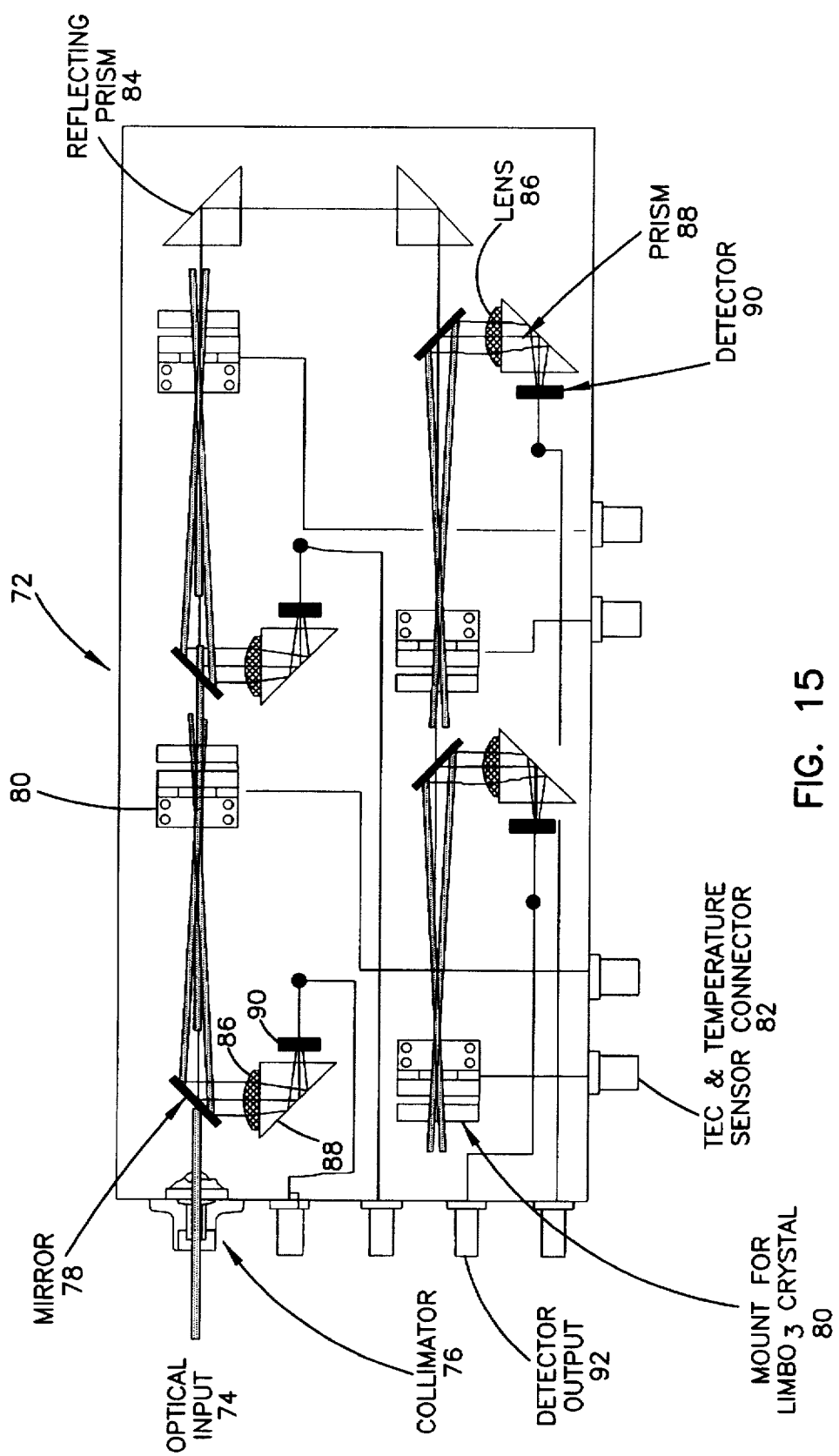
FIG. 15 discloses a variation of the demultiplexer, using a number of the individual elements shown in FIG. 14, that provides a multi-channel receiver for a WDM network.

FIG. 15 discloses a variation of the demultiplexer 72, using a number of the individual elements shown in FIG. 14, that provides a multi-channel receiver for a WDM network. Optical or light input 74 enters the demultiplexor 72 at a collimator 76. The light passes through an aperture in a mirror 78 and is reflected by a holographic grating (not shown) in an optical mounting element 80 including a LiNbO$_3$ crystal. A thermoelectric cooler (TEC) (not shown) and temperature sensor (not shown) may be included with each crystal and accessed for control purposes through connectors 82.

Since LiNbO$_3$ is transmissive in the IR, multiple such elements 80 are cascaded along the path of the light input 74 to provide additional channel reception. Reflecting prisms 84 are used to reflect the light along a second tier of elements 80 within the demultiplexor 72. Of course, those skilled in the art will recognize that any number of tiers and redirection of the optical path 74 may be used without departing from the scope of the present invention. The cascading arrangement used by the demultiplexor 72 eliminates the 3 dB per stage loss that would be incurred if a beamsplitter were used in this application.

The gratings in each mounting element 80 are configured to reflect their optical signals at different wavelengths at slightly shifted angles from the incidence beam path. The reflected signals are deflected by the mirror 78, lens 86, and prism 88 onto their respective photodetectors 90. The outputs from each of the photodetectors 90 are coupled to electrical connectors 92.

For add and drop couplings, shown illustrated in FIGS. 16A and 16B, a variation of the device shown illustrated in FIG. 14 is used. This device allows one or more specific wavelength channels to be coupled out of the single mode fiber that is carrying a multi-wavelength signal, while the remaining signals are transmitted through the device and re-coupled back into another single-mode fiber.

In FIG. 16A, one or more signals carried at different wavelengths are removed from a multi-wavelength transmission beam using holographic gratings for selection of each out-coupled signal. The incoming light from the fiber 94 is collimated by a lens 96 and sent to the holographic gratings 98 in a photorefractive crystal 100, where the gratings 98 are recorded for high efficiency using the techniques set forth in this application. Each grating 98 reflects its corresponding channel signal at a specific direction slightly away from the beam path, where it is passed through the lens 96 against to re-focus it onto separate fibers 102. The remaining wavelength channels, which are not affected by the gratings 98, are passed through the crystal 100 and re-coupled back into a fiber 104.

In FIG. 16B, the device is operated in reverse to serve as an add coupler, where optical signals at different wavelengths are coupled into a fiber link. Each signal 106 is collimated by lens 108, then reflected by the holographic gratings 110 in crystal 112 into a common beam path. This multi-wavelength signal 114 is collinear with the signal which is already transmitted through the crystal 112 from the input fiber 116, and the entire multi-wavelength beam is re-coupled back into the fiber 114. This system provides the advantage that the gratings 110 reflect only their corresponding signals with high efficiency, leaving other out-of-band beams unperturbed. This provides reduced signal loss over using broadband fiber couplers or star couplers, which has been the preferred method without this technology. In addition, because the output signals are all coupled back into a single mode fiber, the device is modular and can be cascaded to accommodate additional signal channels.

Holographic Grating External Cavity Laser

Figure 17:
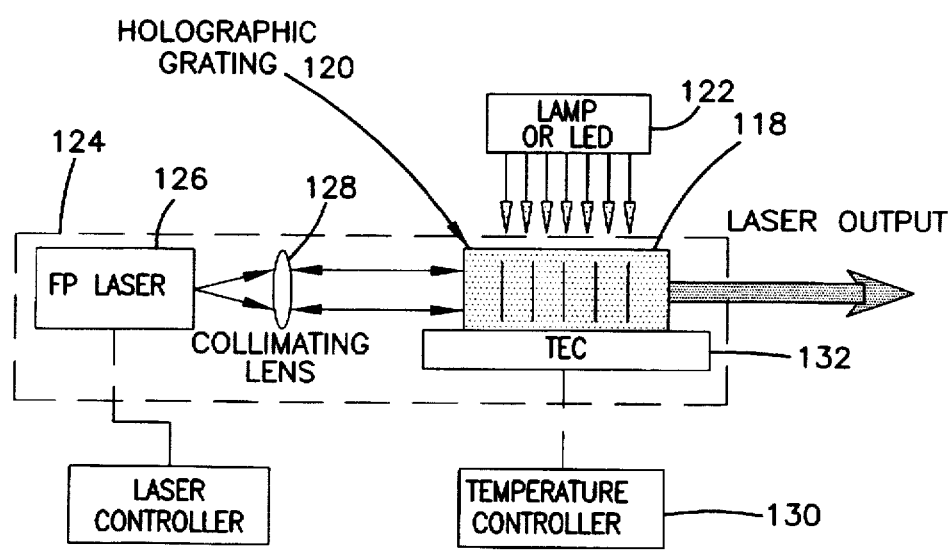
FIG. 17 is a schematic diagram of an external cavity laser using a continuously illuminated, high efficiency holographic grating as the external cavity reflector.

The high efficiency grating described above has another application as the end reflector for an external cavity laser, as described in G. A. Rakuljic et al., "Wavelength Stabilized Laser Sources Using Feedback From Volume Holograms," U.S. patent application Ser. No. 08/122,711 (1993). A crystal 118 incorporating a high efficiency grating 120 and illuminated with an external illumination source 122 is used in an infrared external cavity laser 124, as shown in FIG. 17, where the external illumination source 122 can be an LED, visible semiconductor laser, or lamp to maintain development and extend lifetimes, as specified in the detailed description.

The light from an anti-reflection coated Fabry-Perot laser 126 is collimated by a lens 128 and reflected off the holographic grating 120 in the crystal 118, thereby comprising an external cavity. Since the reflection is highly wavelength selective, the laser 126 is forced to operate at a specific wavelength defined by that of the holographic grating 120. The grating 120 is kept illuminated by the external lamp or LED 122 because the crystal 118 is not photosensitive at the IR operating wavelength of the laser 126. A temperature controller 130 is used to maintain a fixed temperature of the grating 120 and crystal 118 by controlling a thermoelectric cooler 132 coupled to the crystal 118 for increased stability and accuracy in grating 120 response.

Optical Data Storage Devices

Figure 18:
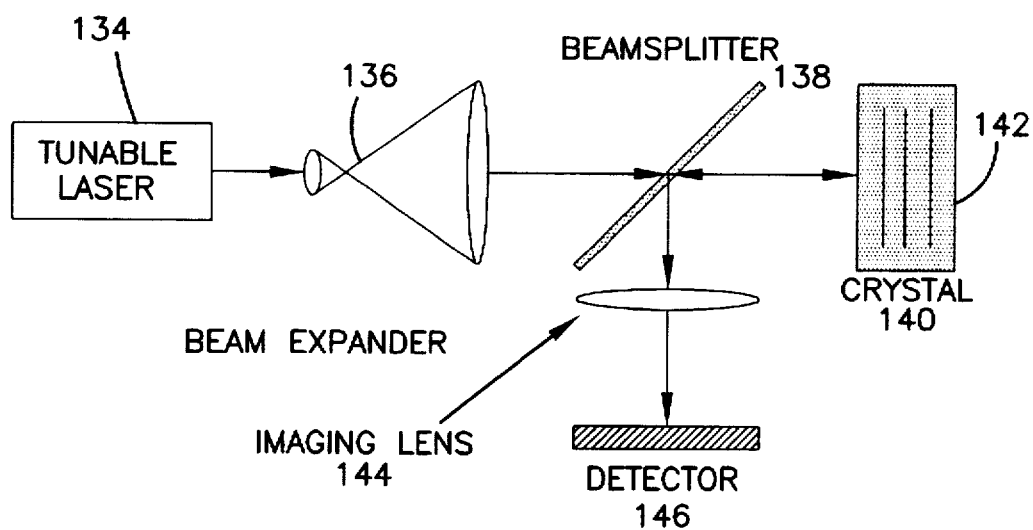
FIG. 18 illustrates a wavelength-multiplexed holographic storage system.

The compensated and continuously illuminated gratings also have applications in holographic data storage, particularly in archival storage. This is applicable to any of a number of approaches (wavelength, angle, or phase multiplexed devices) that have been described in the literature in the past. FIG. 18 illustrates a wavelength-multiplexed holographic storage system, including a tunable laser 132, beam expander 136, beamsplitter 138, crystal 140 with holographic grating 142 therein, imaging lens 144, and detector 146. The apparatus of FIG. 18 can be used for other holographic storage architectures as well.

For archival storage devices, the holographic elements will primarily be kept in the dark until use. Therefore, to maintain maximum lifetime, the gratings are recorded and kept in the compensated state (i.e. without development) until use. Readout of the gratings on first use will tend to develop the gratings somewhat, but since the duty cycle can be expected to be low (or at least less than 100%), the gratings will tend to return to a compensated state from shallow trap electrons until the elements is illuminated when it is next used.

Conclusion

Although there have been described above and illustrated in the drawings various forms and modifications of the invention, it will be appreciated that the invention is not limited thereto but includes all variations and alternative expedients within the scope of the appended claims.

What is claimed is:

1. A device for providing an indication of the operating wavelength from a source, comprising:

means for providing radiation at an operating wavelength in a range that does not photo-excite electrons;

photorefractive crystal means having at least a pair of compensated gratings therein, the compensated gratings being arranged to reflect the radiation at different wavelengths in different directions; and a pair of detectors each responsive to the reflected radiation in different directions.

2. The device as set forth in claim 1 above, wherein the grating wavelengths are in an overlapping relationship, and wherein the device further includes means for detecting the difference in the signals from the two detectors to provide a measure of the offset of the radiation from a chosen nominal operating wavelength.

3. A device as set forth in claim 1 above, wherein the gratings reflect the radiation at selected spaced apart wavelengths to the detectors, the detectors being spaced apart such that a signal derived from either of the detectors indicates that the radiation's operating wavelength has varied outside a chosen wavelength band.

4. The device as set forth in claim 1 above, wherein the device further includes flexure means mounting the crystal and including the means for adjusting the position of the crystal and gratings therein; and thermoelectric cooling means coupled to the device for stabilizing the temperature thereof.

* * * * *